United States Patent
Bennett

(10) Patent No.: US 9,465,756 B2
(45) Date of Patent: Oct. 11, 2016

(54) CONFIGURABLE INTERCONNECTION SYSTEM

(75) Inventor: Jon C. R. Bennett, Sudbury, MA (US)

(73) Assignee: VIOLIN MEMORY INC., Santa Clara, CA (US)

(*) Notice: Subject to any disclaimer, the term of this patent is extended or adjusted under 35 U.S.C. 154(b) by 1197 days.

(21) Appl. No.: 12/976,735

(22) Filed: Dec. 22, 2010

(65) Prior Publication Data

US 2011/0213908 A1    Sep. 1, 2011

Related U.S. Application Data

(60) Provisional application No. 61/289,819, filed on Dec. 23, 2009.

(51) Int. Cl.
| | |
|---|---|
| *G06F 13/00* | (2006.01) |
| *G06F 13/14* | (2006.01) |
| *G06F 13/36* | (2006.01) |
| *G06F 13/16* | (2006.01) |
| *G11C 19/00* | (2006.01) |
| *H03K 19/17* | (2006.01) |

(52) U.S. Cl.
CPC .......... *G06F 13/1684* (2013.01); *G06F 13/14* (2013.01); *G06F 13/36* (2013.01); *G11C 19/00* (2013.01); *H03K 19/17* (2013.01); *Y02B 60/1228* (2013.01)

(58) Field of Classification Search
CPC ........ G06F 13/00; G06F 13/14; G06F 13/36; H03K 19/17; G11C 19/00
USPC ......................... 710/100, 104, 305, 308, 316
See application file for complete search history.

(56) References Cited

U.S. PATENT DOCUMENTS

| | | |
|---|---|---|
| 3,728,679 A | 4/1973 | McIntosh |
| 4,805,195 A | 2/1989 | Keegan |
| 5,144,166 A | 9/1992 | Camarota |
| 5,200,746 A | 4/1993 | Yoshifuji |
| 5,313,501 A | 5/1994 | Thacker |
| 5,513,377 A | 4/1996 | Capowski |
| 5,621,774 A | 4/1997 | Ishibashi |
| 5,652,530 A | 7/1997 | Ashuri |
| 5,832,286 A | 11/1998 | Yoshida |
| 5,872,959 A | 2/1999 | Nguyen |
| 5,920,704 A | 7/1999 | Olnowich |

(Continued)

OTHER PUBLICATIONS

International Preliminary Report on Patentability for International Application No. PCT/US2010/062061, dated Jun. 26, 2012, 4 pages.

(Continued)

*Primary Examiner* — Henry Tsai
*Assistant Examiner* — Christopher A Daley
(74) *Attorney, Agent, or Firm* — Brinks Gilson & Lione

(57) ABSTRACT

An interconnection system, apparatus and method is described where the motherboard may be populated with less than all of the modules that it has been designed to accept while maintaining a configuration such that in the event of a module failure, a memory controller failure, or a combination thereof, the connectivity of the remaining modules is maintained. Where data is stored using a RAID organization of the memory on the modules, the data may be reconstructed to a spare module. The system also provides for the orderly incremental expansion of the memory by adding additional memory modules and memory controllers, while maintaining the connectivity properties.

21 Claims, 24 Drawing Sheets

(56) References Cited

U.S. PATENT DOCUMENTS

| | | | |
|---|---|---|---|
| 5,974,487 A | 10/1999 | Hartmann | |
| 6,031,847 A | 2/2000 | Collins | |
| 6,105,144 A | 8/2000 | Wu | |
| 6,151,289 A | 11/2000 | Rope | |
| 6,157,229 A | 12/2000 | Yoshikawa | |
| 6,205,571 B1 | 3/2001 | Camporese et al. | |
| 6,260,151 B1 | 7/2001 | Omizo | |
| 6,295,568 B1 | 9/2001 | Kelley | |
| 6,301,167 B1 | 10/2001 | Lee | |
| 6,310,814 B1 | 10/2001 | Hampel | |
| 6,378,018 B1 | 4/2002 | Tsern | |
| 6,473,439 B1 | 10/2002 | Zerbe | |
| 6,587,912 B2* | 7/2003 | Leddige | G06F 13/4256 709/249 |
| 6,601,178 B1 | 7/2003 | Gulick | |
| 6,618,791 B1 | 9/2003 | Dodd | |
| 6,658,509 B1* | 12/2003 | Bonella et al. | 710/100 |
| 6,845,461 B1 | 1/2005 | Kim | |
| 6,961,347 B1* | 11/2005 | Bunton et al. | 370/465 |
| 6,968,419 B1 | 11/2005 | Holman | |
| 6,996,686 B2* | 2/2006 | Doblar et al. | 711/157 |
| 7,164,615 B2 | 1/2007 | Park | |
| 7,167,361 B2 | 1/2007 | Lin | |
| 7,206,888 B2 | 4/2007 | Byers | |
| 7,475,187 B2* | 1/2009 | Gregorius | G11C 7/1006 711/104 |
| 7,516,029 B2 | 4/2009 | Kim | |
| 7,539,800 B2 | 5/2009 | Dell | |
| 7,817,767 B2 | 10/2010 | Tell | |
| 7,979,616 B2* | 7/2011 | Bravo | G06F 13/1684 710/107 |
| 8,380,927 B2* | 2/2013 | Perego et al. | 711/115 |
| 8,726,064 B2* | 5/2014 | Bennett | 713/503 |
| 8,886,892 B2* | 11/2014 | Thayer | G11C 5/066 365/189.02 |
| 2003/0091039 A1 | 5/2003 | Ziegler | |
| 2003/0126485 A1 | 7/2003 | Wilcox | |
| 2003/0206164 A1 | 11/2003 | Juenger | |
| 2005/0010737 A1* | 1/2005 | Ware | G06F 13/1684 711/167 |
| 2005/0050255 A1* | 3/2005 | Jeddeloh | 710/317 |
| 2005/0089037 A1 | 4/2005 | Kojima | |
| 2005/0190622 A1 | 9/2005 | Choi | |
| 2005/0223269 A1 | 10/2005 | Stolowitz | |
| 2005/0259692 A1 | 11/2005 | Zerbe | |
| 2006/0026450 A1 | 2/2006 | Bounitch | |
| 2006/0089107 A1 | 4/2006 | Domino | |
| 2006/0095592 A1* | 5/2006 | Borkenhagen | 710/2 |
| 2006/0187715 A1 | 8/2006 | Narvaez | |
| 2006/0218451 A1* | 9/2006 | Abe | G06F 11/1666 714/52 |
| 2007/0124532 A1 | 5/2007 | Bennett | |
| 2007/0147016 A1* | 6/2007 | Osborne | G06F 13/1684 361/803 |
| 2007/0297397 A1 | 12/2007 | Coteus | |
| 2010/0005219 A1* | 1/2010 | Loughner et al. | 711/5 |
| 2012/0331337 A1* | 12/2012 | Otsuka | G06F 13/16 714/6.1 |

OTHER PUBLICATIONS

Communication from the European Patent Office for European Application No. 11168499.9, dated Oct. 22, 2012, 4 pages.

"Mainstream Computer Components," Lec #10 Spring 2006 May 8, 2006, pp. 1-31.

Argument and Amendment filed on Mar. 21, 2011 in the Korean Intellectual Property Office (KIPO) for Korean Patent Application No. 10-2009-7008236, 9 pages.

Notice of Preliminary Rejection dated Jan. 24, 2011 from the Korean Intellectual Property Office (KIPO) for Korean Patent Application No. 10-2009-7008236.

Jun. 22, 2011 Final Office Action, U.S. Appl. No. 11/975,269—14 pages.

Extended European Search Report in Application 11168486.6-2212, dated Sep. 20, 2011 (4 pages).

Korean Intellectual Property Office (KIPO) Office action for Korean Patent Application No. 10-2010-7009902, dated Aug. 3, 2011 16 pages (including English translation).

Lee et al., "Inter-Pin Skew Compensation Scheme for 3.2-Gb/s/pin Parallel Interface," *Journal of Semiconductor Technology and Science*, vol. 10., No. 1. Mar. 2010.

V Hu et al., "Inter-Signal Timing Skew Compensation of Parallel Links with Voltage-Mode Incremental Signaling," IEEE. 2008.

W Chakraborty et al., "Dynamic Thermal Clock Skew Compensation using Tunable Delay Buffers," ACM. 2006.

International Search Report for PCT/US2010/062061, dated Sep. 20, 2011, 9 pages.

Response to Jun. 22, 2011 Final Office Action, U.S. Appl. No. 11/975,269, filed Jun. 24, 2011—7 pages.

* cited by examiner

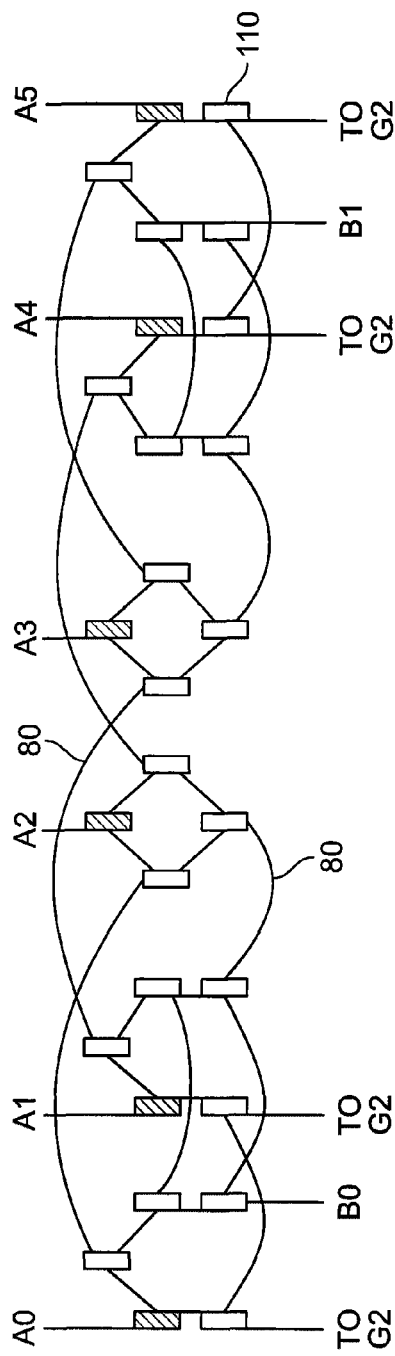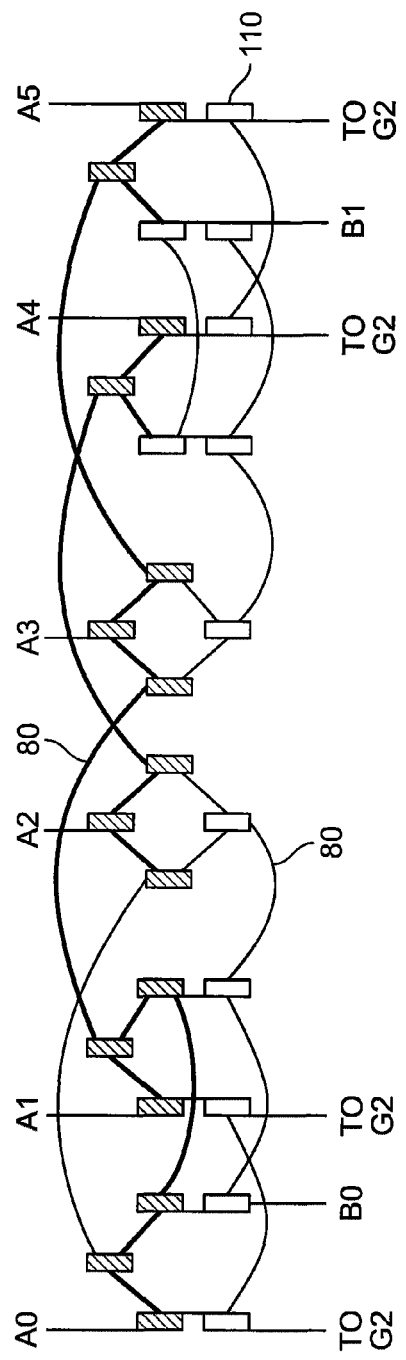
FIG. 5A
FIG. 5B

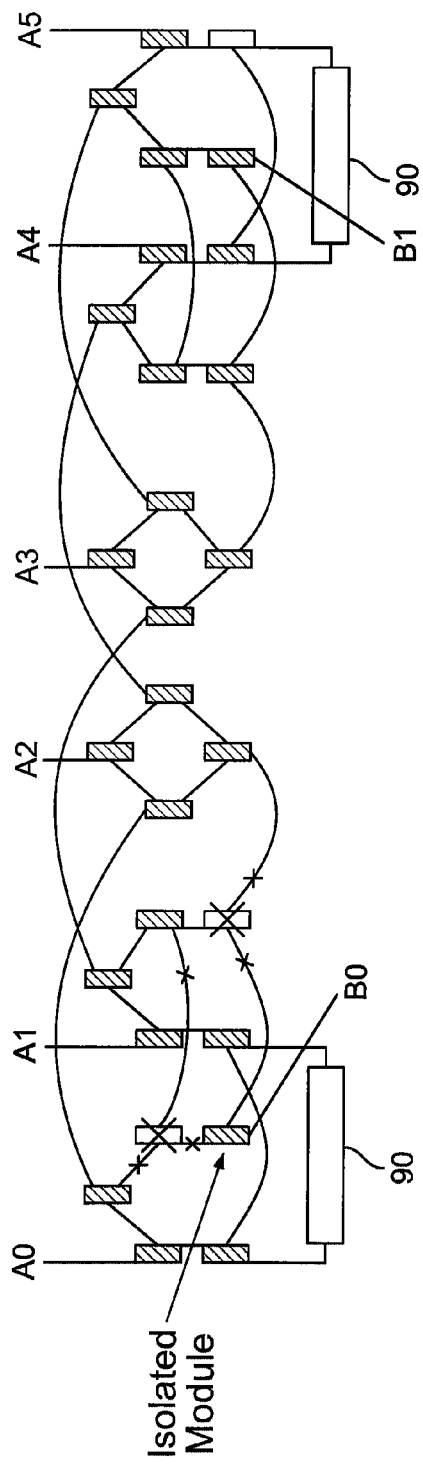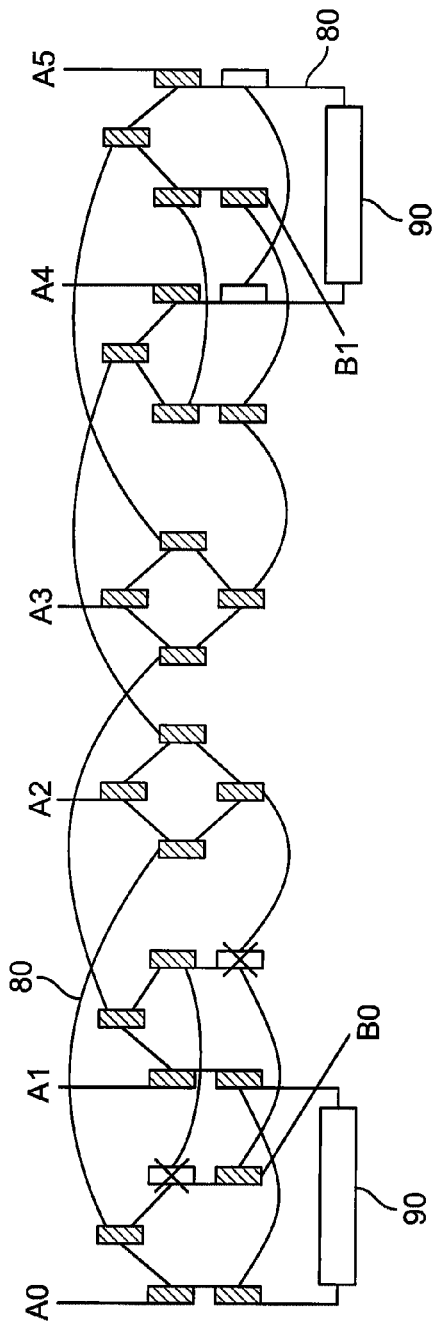
FIG. 9A
FIG. 9B

CONFIGURABLE INTERCONNECTION SYSTEM

This application claims the benefit of U.S. provisional application No. 61/289,819, filed on Dec. 23, 2009, which is incorporated herein by reference.

BACKGROUND

Contemporary computing system memory architectures may result from tradeoffs between cost, performance and the ability to upgrade, for example, the total memory capacity of the system.

Memory systems may provide an upgrade path through the usage of modules. Such modules may be disks using an industry standard interface, dual-in-line solid state memory modules (DIMM) and the like.

A socket and connector interface may be employed which allows each module to be removed and replaced by a memory module that is faster or includes a higher capacity, or merely for the replacement of a failed memory module. A memory system may be configured with unpopulated sockets or less than a full capacity of modules (i.e., empty sockets/connectors) and provided with increased capacity at a later time with memory expansion modules. Generally, such memory systems are not capable of being reconfigured or upgraded while operating in a data base system. The reasons for these limitations may be either hardware related or software related. Often data bus architectures impose limitations as to the continuity of the data bus, the termination of the data bus, or the like.

Memories used in computing systems include, but are not limited to, random access memory (RAM) of all types (e.g., S-RAM, D-RAM); programmable read only memory (PROM); electronically alterable read only memory (EPROM); flash memory, magnetic memories of all types including Magnetoresistive Random Access Memory (MRAM), Ferroelectric RAM (FRAM or FeRAM) as well as NRAM (Nanotube-based/Nonvolatile RAM) and Phase-change memory (PRAM), and magnetic disk and tape storage media. A wide variety of industry standard interfaces are known and used. Some of these memory types are commercially available, while others are still in a prototype or research phase. The memory systems may be volatile memory, non-volatile memory or a combination of memory types and technologies. Other memories which may become suitable for use in the future include quantum devices and the like.

There is a need for memory system and computing system architectures or interconnect topologies that provide flexible and cost effective upgrade capabilities while providing high bandwidth to keep pace with microprocessor operating frequencies, increased interface bandwidth, and the like. Alternatively, lower power consumption, lower memory latency, and similar attributes for the same or similar operational characteristics are also needed.

Such memory systems may be used in data centers and other computing applications where data integrity and permanence are of importance, and the behavior of such a memory system when one or more of the components thereof has failed may be a significant consideration in the design, specification, construction and operation of the memory system and the data center. Similarly, the efficient repair of such systems has an effect on the probability of two memory-device failures occurring within the time that a first memory device failure can be diagnosed and serviced.

Where a memory system is intended to be used to store a large amount of data for relatively rapid retrieval by a using device, such as a computer, including client-server configurations, telecommunications networks, storage area networks, or the like, the architecture of the memory system may take account of a variety of design criteria, balancing the speed of access, reliability, expandability or upgradability, cost, maintainability, as examples.

The stored data may be backed up to other devices (which may be any memory type, including, for example, solid-state devices, rotating magnetic media, magnetic tape, or optical disks). One of the backup devices may be a persistent memory media type having known long-term data retention properties, such as magnetic tape, magnetic disk, FLASH or the like, so as to be unaffected by a power failure. The data, or the media upon which the data has been stored for back up, may be physically moved to, or transmitted to, another location for security or disaster recovery purposes.

Local to the memory system, the use of RAID (originally Redundant Array of Inexpensive Disks, but now applied to a system using any memory type) for storing data in a form where the failure of one or more memory circuits within the memory system can be tolerated is known.

An example of such a RAIDed memory system, which may be used for volatile or non-volatile memory modules arranged in a bus architecture may be found in U.S. Ser. No. 12/273,410, entitled "Method and System for Storage of Data in Non-Volatile Media", by the present inventor, which is incorporated herein by reference.

Examples of memory systems that are suitable for storing large amounts of data for rapid retrieval are found in U.S. Ser. No. 11/405,083, entitled "Interconnection System", by the present inventor, which is incorporated herein by reference.

A purchaser of a memory system may specify the chassis or housing for the memory system to be less than fully populated with memory modules. That is, there may not be a current need for a memory system to have installed the maximum amount of memory that the architecture, the motherboard, the chassis, or the like, can ultimately accept. This may extend to memory controllers, power supplies and other ancillary devices. Taking account of the historical trends in cost of semiconductor devices, a strategy of purchasing only the amount of memory that is currently needed may be attractive.

However, once a memory system is put into use, and data has been stored, the addition of memory to a memory system may present operational difficulties when such an addition is to be done without interrupting the continuous operation of the device.

SUMMARY

A memory system is disclosed having: a motherboard a plurality of connector, and a plurality of point-to-point bus segments, disposed such that each connector is connected to an end of two or more bus segments. A memory controller connects with at least one bus segment. The arrangement is configured such that when a plurality of memory modules is inserted in the connectors and a number M of plurality of memory modules is less than or equal to the a number N of the connectors, connectivity may be maintained between the memory controller and the plurality of memory modules in a first state where a memory module of the plurality of memory modules is either inoperative, or is removed from a respective connectors. At least some of the plurality of memory modules have a configurable switch for routing signals received on a first bus segment to one of a second bus segment, a third bus segment, or a memory circuit associated with the memory module.

A memory system is disclosed having: a motherboard a plurality of connector, and a plurality of point-to-point bus segments, disposed such that each connector is connected to an end of two or more bus segments. A memory controller with at least one bus segment. The arrangement is configured such that when a plurality of memory modules is inserted in the connectors and a number M of plurality of memory modules is less than or equal to the a number N of the connectors, connectivity may be maintained between the memory controller and the plurality of memory modules in a first state where a memory module of the plurality of memory modules is either inoperative, or is removed from a respective connector. At least some of the plurality of memory modules have a configurable switch for routing signals received on a first bus segment to one of a second bus segment, a third bus segment, or a memory circuit associated with the memory module.

In yet another aspect, an interconnect system includes a motherboard, a plurality of connectors, and a plurality of point-to-point bus segments, disposed such that each connector of a first group of first connectors of the plurality of first connectors are connected to three or more first bus segments. An interface is connected to an end of at least one bus segment of the plurality of first bus segments which has having another end connected a connector of the plurality of first connectors. The first interface is adapted to connect to a module controller, and a connector of a plurality of connectors is adapted to connect to a system module. The connectors, the interface and the bus segments are arranged such that connectivity between any two connectors may be maintained when at least two connectors do not have system modules installed.

BRIEF DESCRIPTION OF THE DRAWINGS

FIG. 5a is an interconnection diagram of the connectors and bus segments of a first group of memory modules as shown in FIG. 4, where not all of the connectors have memory modules inserted therein; and FIG. 5b is another an interconnection diagram of the connectors and bus segments of a first group of memory modules as shown in FIG. 4, where not all of the connectors have memory modules inserted therein;

FIGS. 9a, b illustrate a situation where a memory module becomes isolated by the failure of two specific modules and where the communication remains possible through a module controller;

DESCRIPTION

Figure 1:
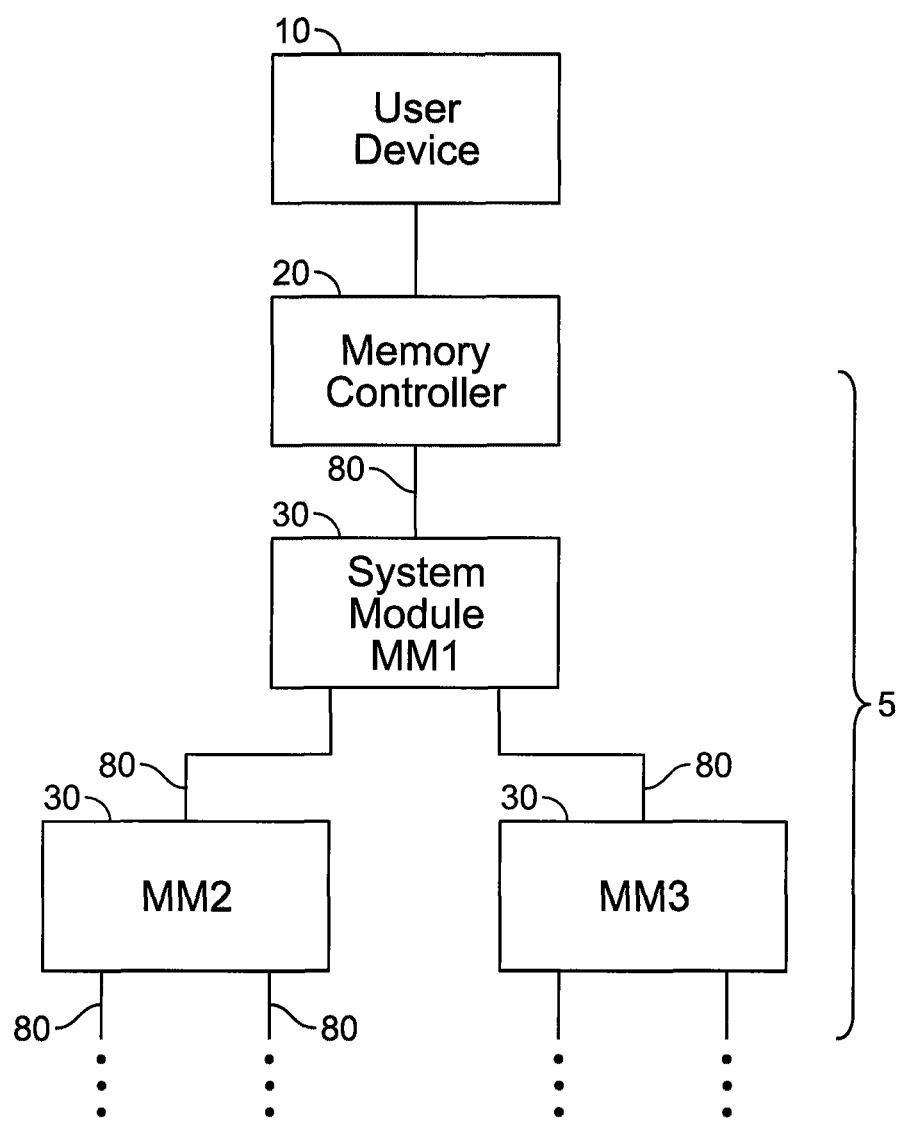
FIG. 1 is a block diagram of a memory system including an interface to a user device.

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

It will be appreciated that the methods described and the apparatus shown in the figures may be configured or embodied in machine-executable instructions, e.g., software, or in hardware, or in a combination of both. The instructions may be used to cause a general-purpose computer, a special-purpose processor, such as a DSP, array processor, graphics processor, or the like, that is programmed with the instructions to perform the operations described. Alternatively, the operations might be performed by specific hardware components that contain hardwired logic or firmware instructions for performing the operations described, or by any combination of programmed computer components and custom hardware components, which may include analog circuits.

The methods may be provided, at least in part, as a computer program product that may include a machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that cause the machine or special purpose hardware to perform any one of the methodologies or functions of the present invention. The term "machine-readable medium" shall accordingly be taken include, but not be limited to, semiconductor and other solid-state memories, optical and magnetic disks, magnetic memories, and optical memories.

For example, but not by way of limitation, a machine readable medium may include read-only memory (ROM); random access memory (RAM) of all types (e.g., S-RAM, D-RAM); programmable read only memory (PROM); electronically alterable read only memory (EPROM); FLASH memory, magnetic random access memory; or magnetic disk storage media, or other memory technology having similar attributes which may subsequently be developed.

Furthermore, it is common in the art to speak of software, in one form or another (e.g., program, procedure, process, application, module, algorithm or logic), as taking an action or causing a result. Such expressions are merely a convenient way of saying that execution of the software by a computer or equivalent device causes the processor of the computer or the equivalent device to perform an action or a produce a result, as is well known by persons skilled in the art.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, in whole or in part, except when such a combination is explicitly excluded. When a particular feature, structure, or characteristic is described in connection with an example, a person skilled in the art may give effect to such feature, structure or characteristic in connection with other examples, whether or not explicitly described.

A connector or connector interface as described herein, such as a memory module connector interface, is not limited to physically separable interfaces where a male connector or interface engages a female connector or interface. A connector interface also includes any type of physical interface or connection, such as an interface where leads, solder balls or connections from a memory module are soldered or otherwise electrically attached to a circuit board. For example, in a stacked die construction approach, a number of integrated circuit die (e.g., memory devices and buffer devices) may be stacked on top of one another with a substrate forming the base and interface to a memory controller or processor through a ball grid array type of connector interface. As another example, the memory devices and buffer device may be interconnected via a flexible tape interconnect and interface to a memory controller through one of a ball grid array type connector interface or a physically separable socket type connector interface. Connection types may include the interface between integrated circuit chips, interconnection conductors on a substrate, between substrates, or on printed circuit boards, or the like.

A memory module may include memory and may also have a controller for the memory, a local memory controller, a switch which may be a configurable switching element (CSE), such as described in U.S. Ser. No. 11/405,083, which has been incorporated by reference, or other switch, and may have other circuitry for processing, transmitting or receiving signals. However, a memory module may only include the memory, and one or more of the other elements may be separately mounted. The allocation of the functions to specific circuits or to a particular architectural level of a system, or to specific physical structures or to software programs in a computer program product is intended for convenience in discussion, as a person of skill in the art will appreciate that the actual physical aspects and computational aspects may be arranged in a variety of equivalent ways.

"Bus" means a signal line or a plurality of signal lines each having one or more interface locations or circuits for "transceiving" (i.e., either transmitting, receiving, or both). Each interface may connect or couple to a transceiver (e.g., a transmitter-receiver) or one of a transmitter or receiver circuit. A connection or coupling may be provided electrically, optically, magnetically, or by way of technology being the equivalents thereof.

The use of the word "bus" herein should not be interpreted to restrict the particular hardware realization of the connection between one or more modules or between the modules and a memory controller or other interface, or to suggest that a particular bus architecture is used throughout a particular product. Various bus arrangements and architectures may be equivalently used. The bus segments may be realized as a plurality of printed circuit traces on a motherboard, cables and connectors, point-to-point wires, optical fibers or waveguides, or the like.

Other electrical connections and components are used to provide for satisfaction of such additional system requirements as power, ground, auxiliary signaling and control, or the like. Such additional connections or components may occasionally be described so as to clarify the description herein; however, such additional connections or components are well known to persons skilled in the art, and the lack of description of these connections or components in any example should not be taken as a suggestion to exclude them.

FIG. 1 shows a simplified example of a memory system 5, where a user device 10, which may be a computer, an interface with a network, an interface with a switching fabric, or the like, connects to a memory controller 20, the memory controller 20 configured to route data to a plurality of modules 30. The user device 10 may be any requestor or source of data to be stored in the memory system 5, the memory system comprised of the interconnected modules 30 and the controller 20.

In the example of FIG. 1, the modules 30 are arranged in a binary tree, connected by bus segments 80. Other configurations may be used, including, daisy chains, ternary trees, quaternary trees or the like. Generally, the inputs and the outputs of the modules 30 are capable of connection to other modules 30 through the bus segments 80 except, for example, where the module 30 a leaf of the tree at a periphery thereof, and some of the connections may be to a memory controller 20, or to topology configuration modules, as will later be described.

A bus segment 80 is shown as a connecting line. The bus segment 80 may be a serial bus, a parallel bus, or the like, and may have active components, not shown, for regenerating or otherwise assisting in the transfer of data between devices connected to the bus. The bus may be unidirectional or bidirectional, and signaling and control functions may be performed either over the bus ("in-band"), or through auxiliary connections (out-of-band") that are not shown. In an aspect, the modules 30 may be connectorized electronic circuits being pluggable into a motherboard (not shown) having a mating connector so as to interface with bus segments 80 connecting the connector to other modules 30, memory controllers, or topology configuration modules that may also be plugged into the motherboard. Memory modules may be, for example, grouped on a circuit board, or comprise one or more substrates for solid-state circuits so that a plurality of memory circuits, controllers and the like may be a single replaceable unit. Alternatively, one or more of the individual functional components may be disposed on separate physical objects and interconnected by any technology that may perform the needed function.

Figure 2A:
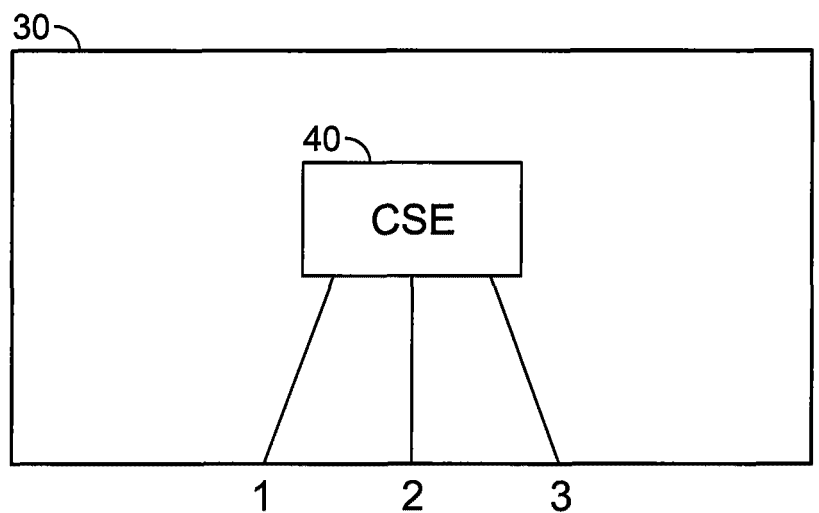
FIG. 2a shows a block diagram of a memory module (MM) as a switch with a configurable switching element (CSE)

FIG. 2a shows a configurable switching element (CSE) 40 on a pluggable circuit card and having three bus interfaces or (1, 2, 3). For convenience, when associated with the bus, interfaces may be termed "ports". A CSE may be an electronic circuit having the capability of receiving and transmitting data on the bus segments 80 and, based on routing commands (which may be either in-band or out-of-band), transferring data, for example, from an input on any port (1, 2, 3) to an output on any port (1, 2, 3) of the module 30. In addition, although not shown or implemented in the configuration of FIG. 2a, the CSE may also route the data to memory circuits located on the module 30, to an external interface, or to other memory of computing circuits.

The CSE may be an electronic circuit such as a field programmable gate array (FPGA) an application specific integrated circuit (ASIC), a microprocessor, or the like, having sufficient memory to store any needed configuration data, or operating instructions, or to buffer data being transferred through the module 30. Alternatively, the memory may be accessed by the CSE circuit and may be located on another physical object.

Figure 2B:
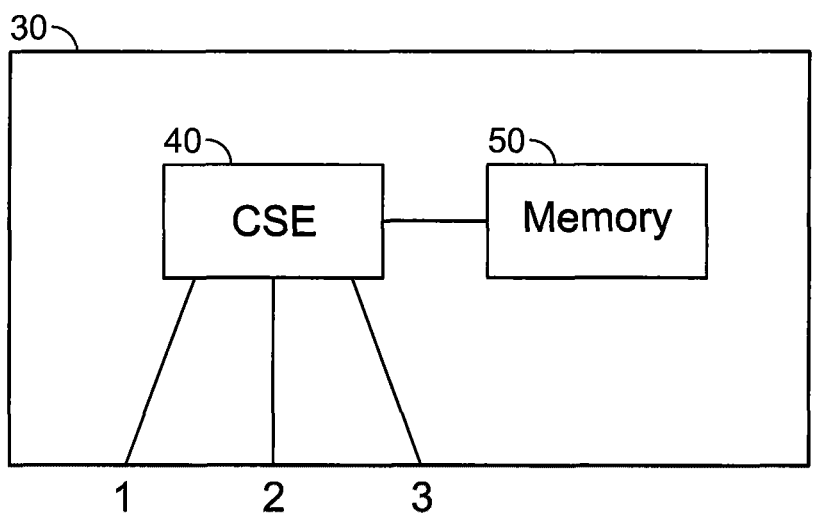
FIG. 2b shows a block diagram of a memory module (MM) configured as a switch with memory circuits.
Figure 3:
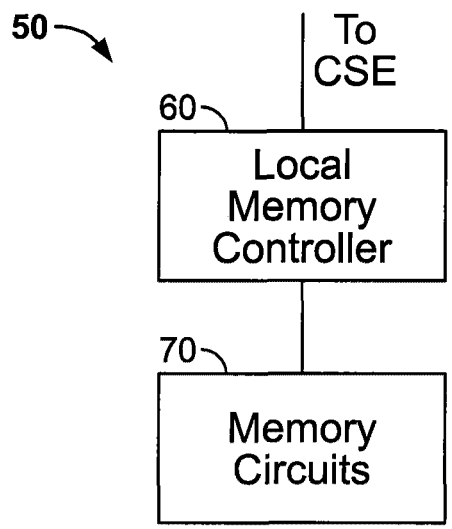
FIG. 3 is a block diagram of the memory of FIG. 2b, where the memory circuit element includes a memory controller.

In another aspect, a module 30b may be configured as in FIG. 2b, wherein an output of the CSE 40 is provided with an interface to a memory circuit 50 on the module 30. Where address information is received by the CSE 40 on the module 30 and the function to be performed is to read or write data to a memory located on the local module 30, the CSE 40 provides a local input/output function for the data or commands to the local memory 50. As shown in FIG. 3, the local memory 50 may include an interface, which may be a module memory controller 60, and associated memory devices 70. The memory devices 70 may be, for example, one or more memory chips using FLASH, DRAM, or other suitable memory type.

While the functions of the CSE 40, the module memory controller 60, and the memory devices 70 are shown separately, this is not indented to restrict the configuration of the circuits and software used to perform the functions. Such functions may be divided or integrated, depending on the technology being used at the time of the design, cost, and other engineering considerations. The architecture of the memory on the module may be a linear bus, a plurality of busses, a tree, or the like, and need not be the same as that of the overall memory system 5.

Figure 4:
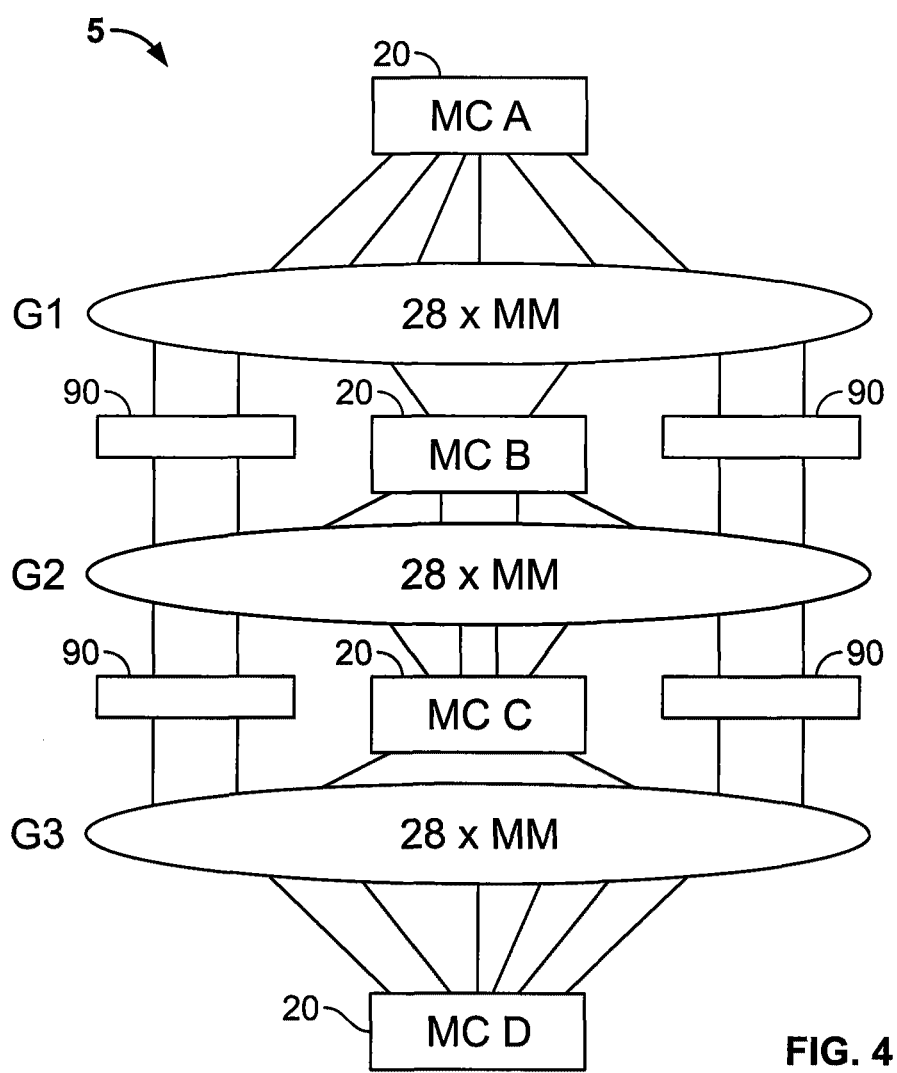
FIG. 4 is a block diagram of a memory system including a plurality of memory controllers, and a plurality of groups of interconnected memory modules.

In another example, a memory system comprised of a plurality of memory controllers 20, and a plurality of memory modules 30, and may be arranged as shown in FIG. 4. Here, groups of 28 interconnected memory modules are associated with one or more memory controllers 20. A memory controller 20 may have a single port as an interface to the memory modules, or multiple ports, depending on the required throughput and other considerations. In an example, three groups (G1, G2, G3) of 28 modules may be assembled as a memory system 5. Alternatively, a single group or two or more groups of interconnected modules may be used. The number of modules 30 in a group is selected for illustrative purposes only, and should not be considered as limiting. While modules 30 may often have both a CSE 40 and a memory comprised of a module memory controller 60, a module 30 may be comprised of a CSE 40 used as a data routing switch, or another switch type.

The topology of the memory system is arranged that bus segments 80 may connect between two groups G of memory modules, if more than one group of modules exists, using topology configuration modules 90. The function of the topology configuration modules 90 will be described later. For the moment, the each of the topology configuration modules 90 may be considered to be a passive connection between two bus segments 80.

Such an arrangement and connection of modules may exhibit fault tolerance characteristics. Generally, two arbitrary module 30 failures, or two arbitrary module controller 20 failures may be tolerated without loss of connectivity to the remaining modules 30 of the system 5. Providing that the data has been stored in the modules 30 so as to implement a RAIDed data storage system, the data stored in the memory system 5 at the time of a failure may be recovered. With a RAID 6 system, two module failures may be tolerated even if the data in the failed modules are in a same RAID group of modules.

When data is being stored in a highly reliable manner, each detected component failure should initiate a repair (maintenance) action, so that the failed component can be replaced prior to the next component failure. Such a maintenance action may also include recovery of the data to a spare module, and any other preventive steps that may be desirable to avoid data loss. The recovery of the data may commence upon detection of the failure. Some of the maintenance actions may need human or mechanical intervention, such a replacement of a failed module, while others may be initiated and performed automatically. Second failures may also be considered to have also occurred when there was some undetected component failure extant at the time of the detected failure, or a second failure was induced during the repair process.

The configuration shown in FIG. 4 may be considered to be fully populated with modules 30. However, there may be circumstances where not all of the locations connecting to the bus segments 80 are occupied by modules 30. An intermediate situation may occur, for example, when only one of the three groups G has modules 30 present.

FIG. 5a shows a simplified schematic of group G1 with a minimal population of modules 30. The figure may represent connectors 110 on a motherboard, each connector 110 terminating three bus segments 80. Locations on the motherboard where modules 30 have been inserted into connectors 110 shown as hatched. In this example, a memory controller 20 is presumed to have 6 bus interfaces or ports, A0-A5; and each interface may communicate with a port of one of the installed memory modules 30. The memory controller 20 may be, for example, a single memory controller 20 with a binary tree of 5 CSE switches to provide the 6 port connections, or any other purpose-designed device.

The bus segments 80 connecting between the connectors 110 should be considered as logical connections. That is, the physical length of the lines 80 in the figures may not represent the lengths of the bus segments 80, nor is the specific physical location of the connectors 110 on the motherboard necessarily intended to be represented by the positions of the connectors 110 in FIG. 5. The actual bus segment lengths and connector locations would be determined when the system is designed, taking account of other factors: for example, the lengths of the signal traces on the modules 30.

Each of the 6 memory modules 30 communicates with a port of the memory controller 20. By using a total of 6 memory modules, a 4+1 RAID configuration is possible, and there is an additional module already installed as a spare module. That is, if a failure occurs in one of the modules 30 of the RAID group, the data for the failed module can be reconstructed into the spare module without waiting for a replacement of the failed module. Providing that the failed module is of a type where the module can be replaced by "hot swapping", the failed module may be replaced with a working module, and this replacement working module becomes the spare module. In this example, connectivity is not provided to the memory controller B, or to memory groups G2 or G3, as there are no modules 30 installed at the connectors whose associated bus segments connect to memory controller B or to memory groups G2 or G3. Moreover, connections between the individual memory modules are effected through memory controller A, and may not require any of the bus links connecting connectors with each other.

In another population increment, shown in FIG. 5b, a total of 16 memory modules are installed. The 16 modules may be allocated as three 4+1 RAID groups plus one spare module. The spare module may be any one of the positions that are shown as having an installed memory module (hatched box). Other patterns of modules may also have the same or similar properties. In particular, the pattern may be flipped left-for-right about the vertical center line of the figure.

This arrangement of installed modules has similar properties to that of FIG. 5a, except that a failure may now occur in any installed module 30 of any RAID group. Connectivity remains to all of the operating modules 30 through either the memory controller ports A0-A5, or by routing data through other modules 30 and bus segments 80, using the CSE 40 of the modules 30, so that data of the failed module can be recovered into the working spare module. One may observe that there are circumstances where two modules can fail and the connectivity is still sufficient to reconstruct the two RAID groups associated with the failed modules. However, at least one of the failed modules may need to be replaced, if the memory system was considered to be substantially full of data. Alternatively more than one spare module can be installed.

Flexibility in assigning physical modules to RAID groups may be a design objective. Where any module 30 of the memory system 5 may be assigned to a particular RAID group, the memory system may freely adapt to the consequences of the failure of a module 30 in an arbitrary location, without having to again re-copy the recovered data to the module which has replaced the failed module. Waiting to begin the recovery of data until a failed module has been replaced, so that the data can be recovered into the failed module location, would delay the start of the recovery process, and this may be considered to introduce a higher risk of data loss. Nevertheless, depending on the application for which the memory system is intended, such policies can be considered.

In the configuration of FIG. 5b, some of the modules installed in the connectors are capable of communicating with other modules installed in the connectors either directly, or indirectly through one or more intermediate modules 30 over the bus segments 80 associated therewith. Modules having such connectivity may be identified in FIG. 5b as being connected by bolder lines. Currently unused bus segments 80 are shown in the same line width as previously.

Figure 6A:
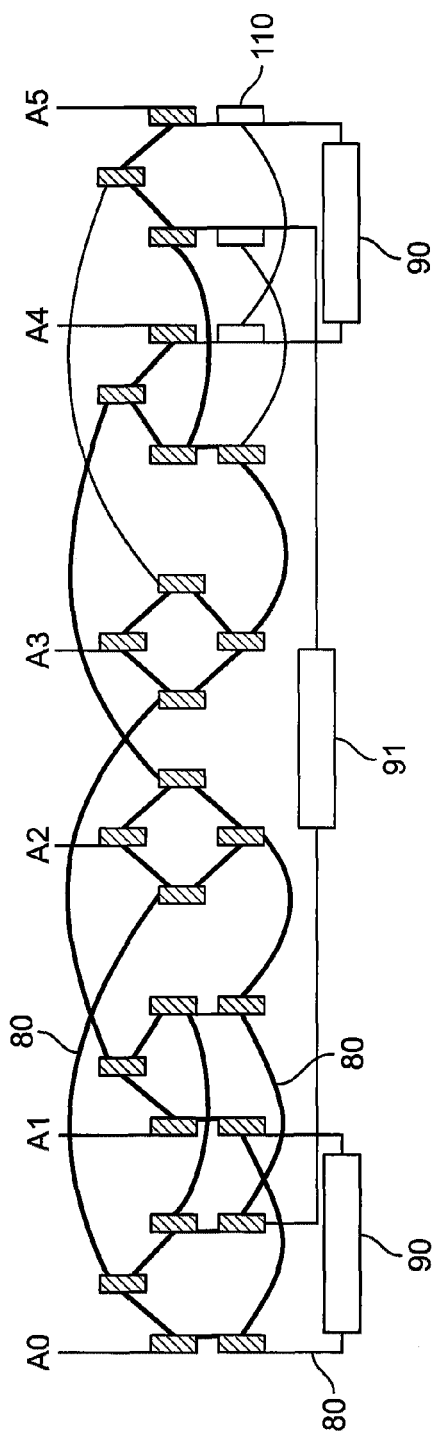
FIG. 6a is an interconnection diagram of the connectors and bus segments of a first group of memory modules as shown in FIG. 4, where not all of the connectors have memory modules inserted therein and where configuration modules are used to provide additional connectivity.

FIG. 6a illustrates the group G1 where 26 modules are installed, and there are five (5) 4+1 RAID groups and a spare module. One should note that installing the remaining two modules so as to reach a total of 28 is equally possible and increases the number of hot spares to three. By populating all 28 connectors of a memory group the air flow pattern may be more regular, although dummy modules would also serve.

Where 26 or 28 modules are installed, it may now be beneficial to provide connectivity between modules in the third rank of memory group G1. Previously, the bus segments 80 that may be used to connect to memory controller B, or to another memory group G2 or G3 did not serve an active function. Here, configuration modules 90, 91, which may be passive or active devices, may be used to connect bus segments 80 within memory group G1 so that additional connectivity is provided between the modules of the memory group. In this circumstance, the failure of any two modules does not isolate modules from memory controller A or any of the other modules 30 of the memory group. In this circumstance, the data from the two failed modules can be reconstructed as before.

It should be appreciated that the operation of the memory system 5 is being described in a simplistic way here so as to better explain the subject of connectivity when there is a module failure. Other RAID configurations, including longitudinal and transverse parity, broad striping, and the like, may be used to achieve other system performance objectives. The topological configuration of FIG. 6a provides the interconnection configuration to maintain connectivity with two failed modules.

Figure 6B:
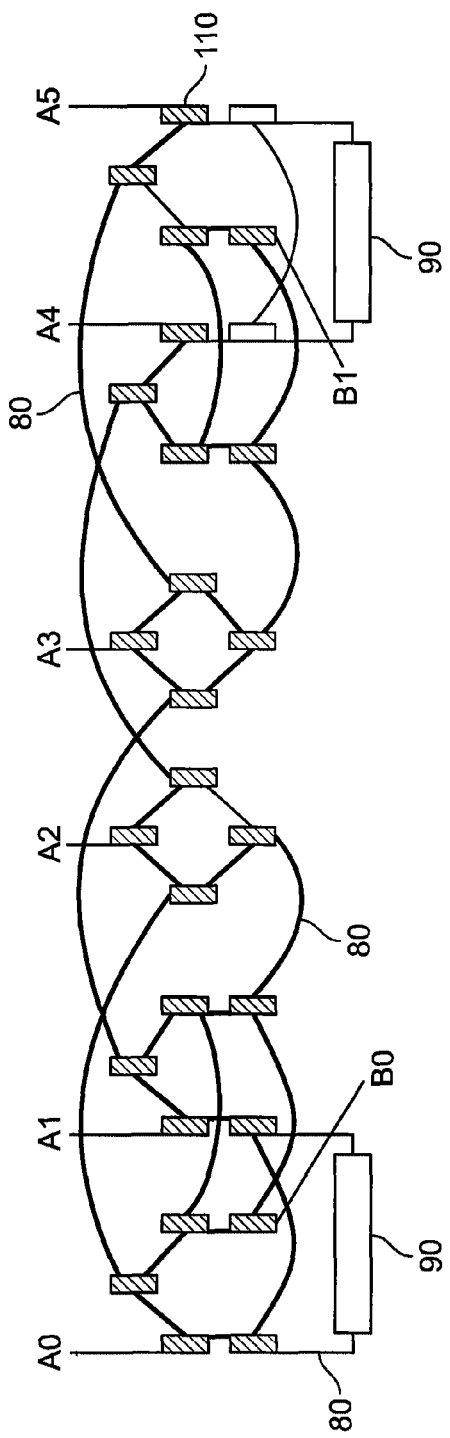
FIG. 6b is an interconnection diagram of the connectors and bus segments of a first group of memory modules as shown in FIG. 4, where not all of the connectors have memory modules inserted therein and where configuration modules and a connection to a second memory controller are used to provide additional connectivity.

Alternatively, as shown in FIG. 6b, two of the topological configuration modules 90 may be used on the bus segments that could have been used so as to connect to memory groups G2 and G3, while the remaining bus segments may be connected to two of the ports (B0 and B1) of a second memory controller B. Providing that memory controllers A and B can connect to each other externally to the memory system 5, such as, for example, through a user device 10, the connectivity would likewise be maintained in a situation where there are two failed modules and one failed memory controller. Maintaining connectivity between modules during a failure event may involve routing the data through one or more modules so as to establish a path replacing a path terminating at the failed module.

Figure 7A:
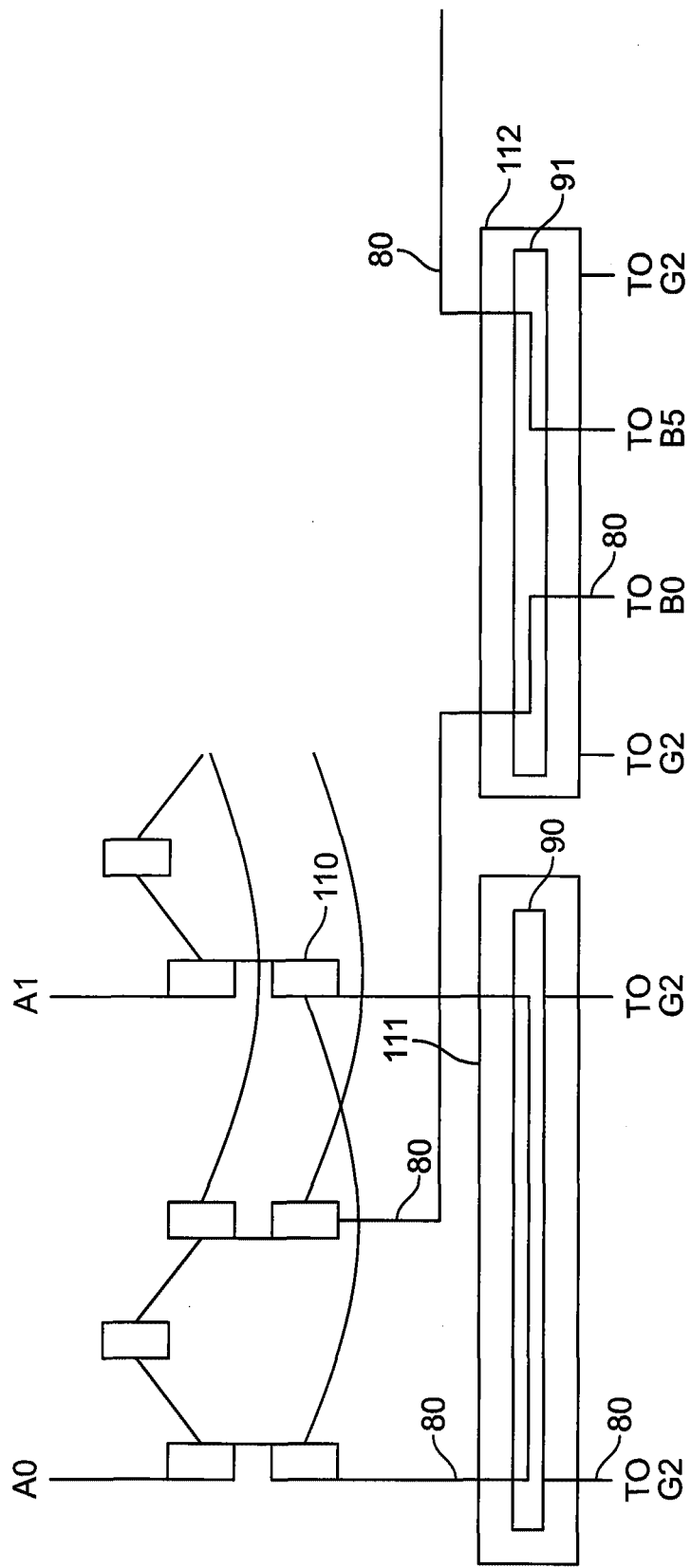
FIGS. 7a, b are details of FIG. 6a, b illustrating the use of configuration modules, where the modules may be used to route a bus to another group of memory modules, to a memory controller, or to provide an intra-group connection.

The topological configuration modules 90, 91 may realized, for example, as shown in FIG. 7a. This figure shows a subset of the modules of FIG. 6b. The topology configuration modules 90, 91 may be circuit boards pluggable into connectors 111 and 112, respectively. In this example, connector 111 terminates two bus segments 80 connecting to modules 30 of memory group G1, and two bus segments 80 connectable to memory group G2 (if present). The bus segments 80 leading to G2 may terminate in a corresponding connector 111 associated with G2. Alternatively, a connector 111 may be shared between G1 and G2. The number of connectors 111, and whether the connectors 111 are separate connectors or shared resources, is dependent on the detailed design and board layout, and the arrangement shown is merely illustrative. The topology configuration module 90 provides the connections between the pins of connector 111 so as to realize the desired arrangement of connections to the modules and the memory groups. In the example shown in FIG. 7a, two modules in G1 are connected to each other. The use of separate reference numerals 111 and 112 is for convenience in discussion the use of devices 90, 91 pluggable into the receptacles, and may not indicate that the connectors 111 and 112 are different from those at positions 110.

Connector 112 is adapted to receive topology configuration module 91. In the arrangement shown in FIG. 7a, connector 112 terminates bus segments 80 connecting to two modules 30 of group G1, two bus segments 80 connecting to modules 30 of group G2 (if present) and to ports B0 and B5 of memory controller MC-B (if present). In the example shown, the bus segments 80 of two modules 30 of group G1 are routed to ports B0 and B5 of MC-B using the configuration module 91. Each of the bus segments 80 at the interface between memory group G1 and memory group G2 may be terminated, for example, at a connector 111 such that a topology configuration module 90 may be used to complete a connection of the bus segment 80 between the memory groups G1 and G2.

Figure 7B:
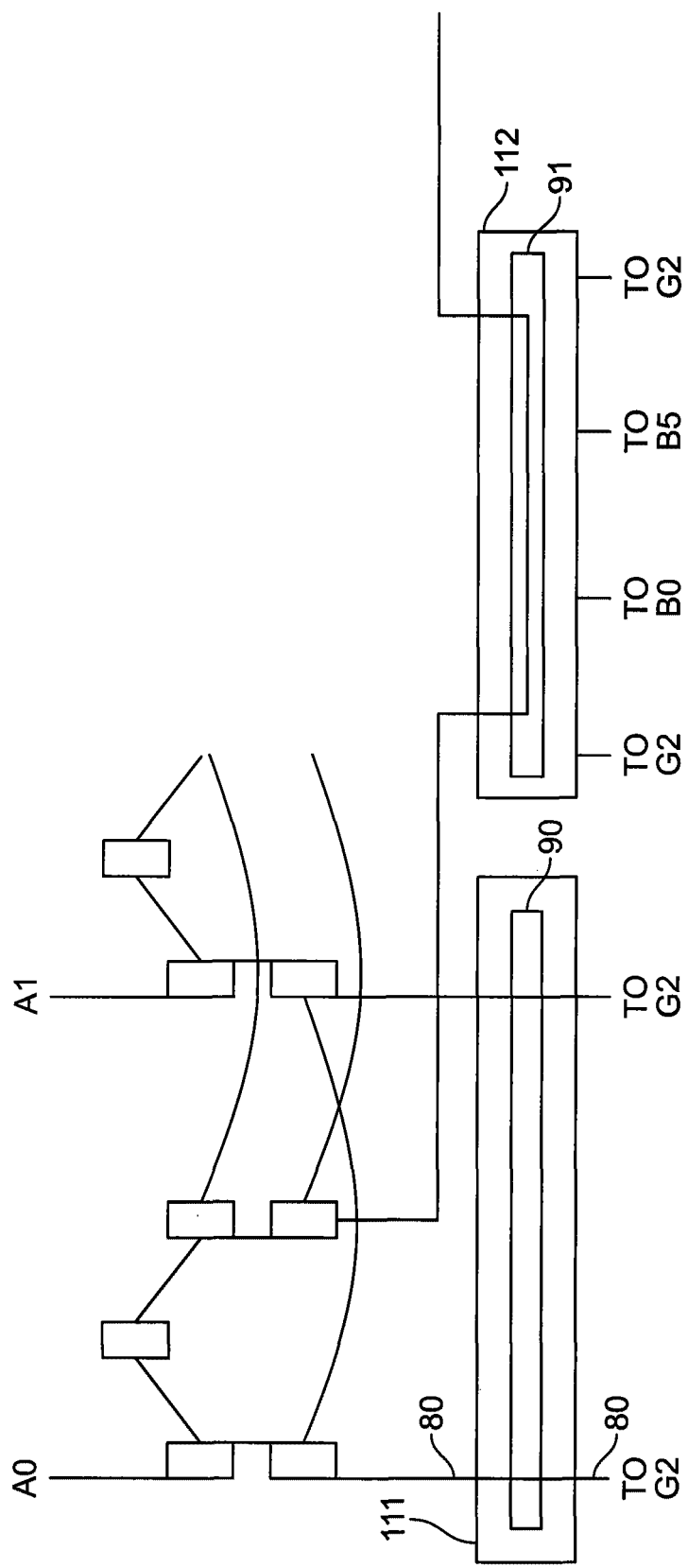

FIG. 7b shows another system configuration that may be realized using alternative arrangements of the connections in topology configuration modules 90 and 91. Here, topology configuration module 90 connects two segments 80 connected to two modules 30 of group G1 to two bus segments 80 each connecting to a different module 30 of group G2. Topology configuration module 91 is arranged to connect two modules 30 of group G1 to each other.

Alternatively, the memory system may be configured so that passive topology configuration modules While specific connections between components are shown in the examples, this is not intended to restrict the particular connections to be made by either of the topology configuration modules. Further, in addition to being shared between groups of modules, the topology configuration modules may be combined with each other, or otherwise divided. Generally, this is a practical design consideration relating to the location of the bus segments and modules on a motherboard, the number of connector pins available, and the like.

The connections within the configuration modules 90, 91 are shown as connecting links, which may be either passive or active. That is, the routing between the connector pins may be entirely passive connections such as printed circuit board traces, or may be active, such as CSE or, other switches which may, for example, be micromachined devices, or the like, or a combination of technologies. Where the connections are passive, the configuration is changed by removing the current version of the topology configuration module, and inserting a topology configuration module having the desired connectivity.

The remainder of the memory system 5 may not be present at the time of initial configuration. That is, separate motherboards may be provided for memory groups G2 and G3, may be installed as needed, and may be connected to each other by replacing the topology configuration modules configured so as to implement the solid line connection in FIG. 7 with topology configuration modules configured so as to implement the dashed-line configuration. [may need to add the dashed modules to the figure.

Alternatively, a motherboard for G2 and G3 may be integral with the motherboard for G1, and merely not populated with modules until desired. The module configurations of each group may be full or partial configurations, depending on the system requirements at the time. Each of the groups may be operated independently as was described for group G1, or the groups may now be connected to form a larger array of modules.

Figure 8:
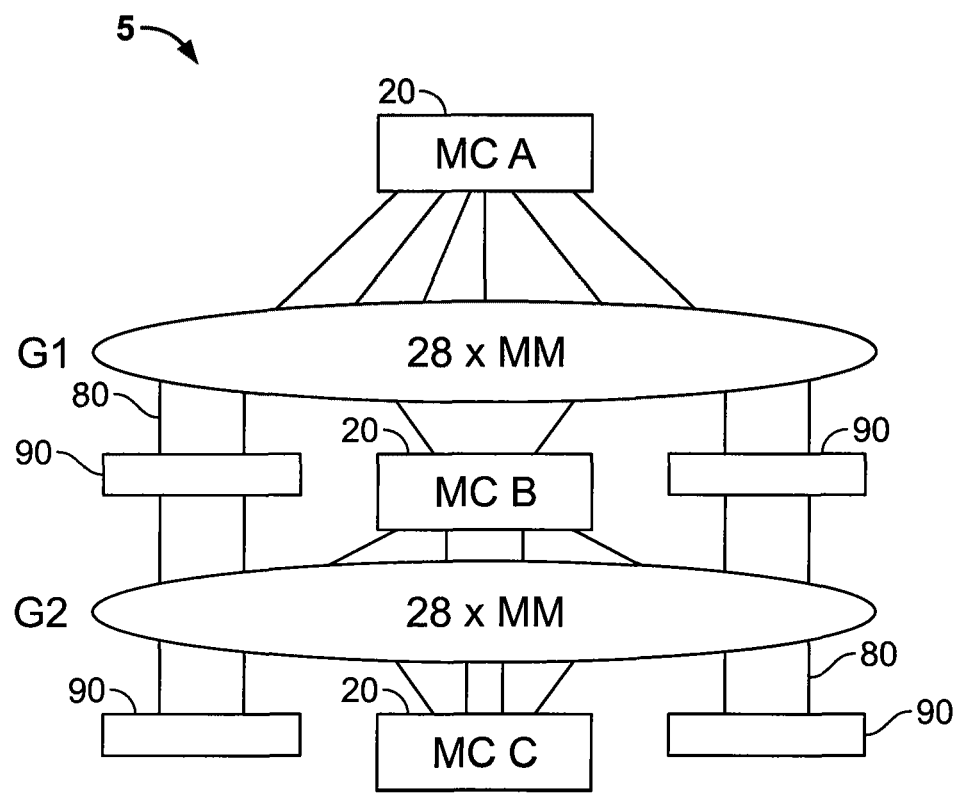
FIG. 8 is a block diagram of another example where two groups of memory modules are connected to three memory controllers.

FIG. 8 shows a situation where groups G1 and G2 are populated and have three memory controllers MC-A, MC-B and MC-C, although any two of the memory controllers 20 may be replaced with appropriate topology configuration modules 91 if a single memory controller 20 is considered adequate. The memory controllers 20 are shown each having 6 ports. However, memory controllers 20 having a fewer or greater number of ports may be used and the bus segments 80 not terminating in memory controller ports may be connected using additional topology configuration modules.

In another example, in a interconnection system having module groups G1, G2, and G3, there could be, for example, four memory controllers 20, MC-A through MC-D, and a total of up to 84 memory modules which may have full communication with each other, even with two module failures or memory controller failures. The probability of such a group of failures occurring randomly is small; however, induced failures during servicing are considerably more common, including removing the wrong module, or damaging a connector, as examples, no matter how many procedural or physical safeguards are presumed to be in place to prevent such an occurrence.

The term failure has been used in the sense that a module 30 or a controller 20 has become inoperative, unreliable or has reached the end of a service life, and needs to be replaced. In some instances, a failure may affect, for example, only one of the memory 70, the memory controller 60 or the CSE 40. Where the CSE 40 remains operative, the module 30 may continue to function in the sense of providing module connectivity, although being inoperative for the storage of data. Whether such partial failures are considered in the operation of the system would be a matter of policy.

An example where three memory groups are present was shown in FIG. 4. However, the examples presented here are not intended to limit the number of modules in each group, the number of memory controllers, or memory controller ports, or the number of memory groups. The internal architecture of a module may differ from the overall system architecture, or adopt some or all of the features thereof, depending on the data storage requirements allocated at the module level.

The expansion of a system from an initial installation of memory modules to that of a larger group of memory modules may be performed in several ways. In an example, where group G1 is already populated and being used, and it is desired to increase the capacity by a full group, each of the connectors 110 of the second group, G2, may be populated with a module 30, the existing topology configuration modules of G1 remaining in place. The modules 30 will have been connected to the power source appropriate for G2 and be energized. Such modules may then be accessed, for example by memory controllers MC-B, or MC-C either singly or by both controllers if both of are installed. MC-C may have been installed or a topology configuration module installed in place thereof. The remaining topology configuration modules 90, 91 of G2 may be inserted so as to configure the group G2.

Once the modules of G2 have been installed, they may, for example, be initialized and the performance thereof verified by conducting a predetermined self test or by accessing each of the modules 30 through the bus system. A memory controller MC, as part of an initialization or start-up sequence, may conduct a discovery process, by which the specific module locations in the memory system that may be accessed directly or indirectly through the bus segment network may be ascertained. Once this process is completed, the operability of the new group, G2 in this instance, may be confirmed. However, at this juncture, there may still be no connectivity to the between groups G1 and G2 except through an external path between the appropriate memory controllers.

When the memory group G1 is fully operable, data need not flow over the bus segments of G1 that are joined internal to G1 by the topology configuration modules, as there exists full connectivity between the modules without the use thereof. In preparation for activating memory group G2, this status may be confirmed, so that removing the topology configuration modules associated with G1 will not affect performance. Generally, this situation would obtain when all of the installed modules of G1 are operable.

The topology configuration modules 90, 91 may be replaced with the alternate topology configuration modules 90, 91 effecting the dotted line connection between memory groups G1 and G2 shown in FIG. 7. That is, a physical bus connection would then exist between memory groups G1 and G2 through the configuration modules.

Alternatively, MC-B may have been installed, or the topology configuration module previously installed may remain in place. Note that while the wiring of the configuration module that had replaced MC-B in G1 has been shown in FIG. 7 for the connection replacing port B0, such configuration module would have had a similar wiring so as to replace at least B1. The remaining ports B2-B5 would have been associated with G2 and while such topology configurations would not have been needed for completing the network of G1, such connections may be included in the design of the topology configuration module so that the addition of G2 to the memory system may be made without replacing the module if the memory controller MC-B is not to be installed.

A topology configuration module may combine the functions of joining pairs of bus segments either within a group or joining bus segments of two groups, or connection one or more of the bus segments to ports of one or more memory controllers.

After replacing the installed topology configuration modules with the alternate topology configuration modules, the bus segments 80 are physically connected on some of the paths between memory groups G1 and G2. Some of the bus segments 80 may also be connected to ports of memory controllers 20. At this juncture, the routing of data over the bus segments may change when there is a module failure of a module of G1. Instead of being routed through the bus segments connected within G1 by the topology configuration module, the data could be routed into G2 so as to pass through a module 30 having connectivity between the two desired modules of G1. Alternatively, the data could be routed through another memory controller, MC-B providing that the controller has been installed.

When both G1 and G2 are installed, configured, and active, the memory space represented by the memory on the installed modules is increased. In this example, it has been doubled. The memory system may be considered to be represented by a logical address space, mapped to physical address space. As such the logical address space has been doubled, and new data can be written to the added memory. Such physical memory may be configured as RAID groups, or in any other manner consistent with the existing stored data; or have another RAID configuration, or some other configuration, providing that operation of the memory system accounts for the differing functions of the memory groups.

Should a module of groups G1 or G2 fail, a spare module of groups G1 or G2 may be used to store data reconstructed using RAID so as the preserve the integrity of the stored data. In some circumstances, the module selected may be restricted to particular locations, such as to be within the memory group where the failure has occurred. However, such a restriction may not be needed, depending on the system configuration and the RAID strategy employed. Over a period of time, due to either failures of modules, or the migration of data associated with wear leveling or wear-out replacement of modules if FLASH memory is used, the data may be eventually located in modules that are different from the set of modules in which the data was originally stored. Such changes may be accounted for as a mapping table between the logical address space and the physical address space.

Where the modules are allocated to RAID groups without consideration of their location in the memory groups, there may be situations where, in addition to two module failures, where each module is in a separate RAID group, the failed modules sever the connectivity of another module that is in a RAID group that is common with one of the failed modules. This situation is shown in FIG. 9a, which corresponds to the configuration of FIG. 6b. In such a situation, communication with the isolated module is possible indirectly through the memory controller MC-B. Of course MC-A and MC-B would need to be connected to each other, at least indirectly, for the data path between MC-A and MC-B to exist. This may be through a user device 10, an external switch fabric, or the like.

By analyzing the memory system as a network, it is possible to identify the modules that are susceptible to being cut off by two module failures, and to establish an allocation rule: for example, that the failed modules are not assigned to a same RAID group. Alternatively, the data in a memory module that is in danger of being cut off by a second failure may be immediately copied to a spare module as a precaution. The module that has been copied may then be erased and used as the spare memory module. Using an external indirect connection in these instances should not be a burden on the overall system throughput as the indirect path is used to access only the isolated module.

Figure 10:
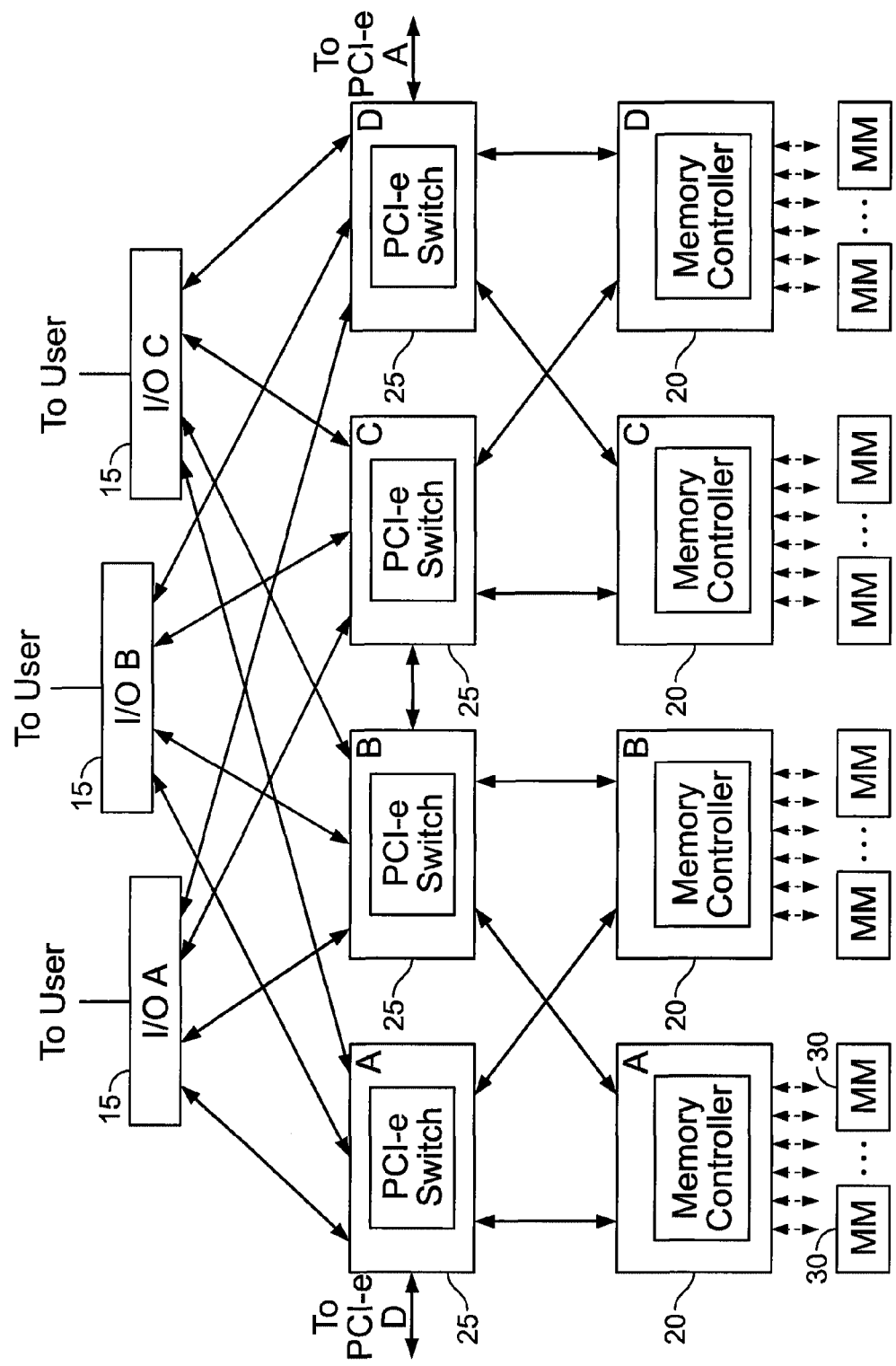
FIG. 10 is a block diagram showing a memory system where the memory controllers are further interconnected by a network of PCI-e switches so as to provide a plurality of alternative communications paths.

A data storage system that is compatible with indirect access is shown in FIG. 10. The memory controllers MC-A through MC-D associated are interconnected through a fabric of PCIe switches 25, configured so that at least two of the memory controllers connect to each other through the PCIe switches. For example MC-A and MC-B are connected to each other by PCIe switches A and B. In one aspect, the input to MC-A is routed through PCIe-A, and the input to MC-B is routed through PCIe-B. But, an alternative path exists between PCIe-B and MC-A. Likewise an alternative path exists between PCIe-A and MC-B. So, whenever needed, the data for modules more directly connected to MC-A may be routed to the same modules by forwarding the data to PCIe-B and using data paths terminating at PCIe-B to effect the data transfer. It may be seen that data from PCIe-A may be routed, at least indirectly, to any of the other PCI-e switches or to any of the memory controllers MC. Thus, at a high level in the system architecture, data may be routed so as to reach any of the modules in the memory system comprised of the modules 30, even if two of the bus segments are inoperable due to a failure of memory modules.

It is evident that additional modules 30 may also fail without loss of data or connectivity, providing that no two modules have failed in a RAID group having only single parity as the protection against data loss. More robust RAID arrangements are possible so that more than one module failure in a RAID group may be tolerated. In these circumstances, the flexibility of routing of data associated with arrangements such as shown in FIG. 10 provide a particularly robust performance with respect to data loss.

Figure 11:
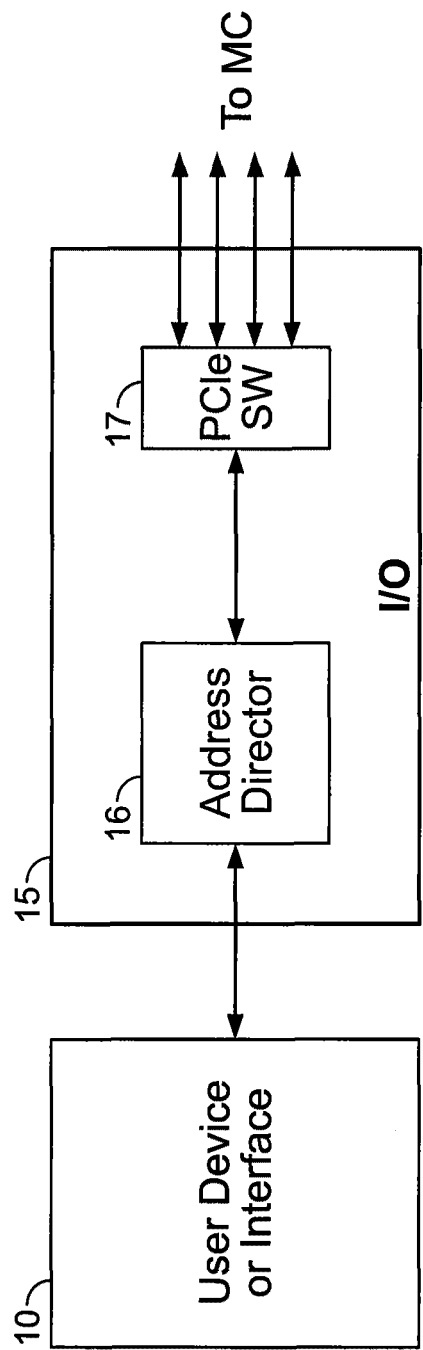
FIG. 11 is a block diagram of an input/output module of FIG. 11, where the address data received from a user device or interface is used to route the data to an appropriate memory controller.

At a still higher level in an interconnected system, the interface with the user device 10 may be through an input/output module 15. An example of such an input output module is shown in FIG. 11. The input/output module 15 may be comprised of an address director 16 and a PCIe switch 17. The logical address associated with data to be read or written is decoded in the address director 16, and the logical address is associated with a physical address that has been assigned by the memory management system software to the physical location where this logical data address is stored. At this level of the system, a decision may be made as to which of the memory controllers 30 is the target destination for the data or command. The further routing of the data may be deferred to a lower level, such as at the PCIe switches 25, which may be interposed between the input/output module 15 and the memory controllers 20. Where the input/output module 15 associates logical addresses of the data as provided by the user device 5 with the physical location of the data in the memory system, at least at a RAID group level, the memory system may be treated as a single mass memory system, if desired, with the details of the operation of the memory system being separated from the user device operation. The amount of the memory, and the logical addresses allocated to a user device may be changed by reallocating the logical address space.

As shown in FIG. 10, there are three input/output modules 15, each communicating with a separate user device 10. Due to the interconnections previously described and the translation of the logical address space to physical address space, any location of the physical memory may be allocated to any of the user devices 10. In other situations, the memory may be allocated so that individual memory modules are associated with specific user devices 10.

RAID groups, for example may be allocated to individual memory controllers 20. By doing so, the information associated with the storage of data in a RAID group is found in a single memory controller 20. Should the memory controller 20 fail, a number of strategies may be used to recover the data. As has previously been described, the modules usually serviced by MC-A may now be serviced by MC-B, although the total bus length may be longer. The mapping tables for a RAID group may be stored with the RAID group in modules 30 of the RAID group. A portion of the mapping table, containing dynamic data may be mirrored in another of the memory controllers 20. In another aspect, the memory management system described in U.S. Ser. No. 12/273,410 may be used to reconstruct the mapping for a RAID group even if the most recent transaction data has been lost.

In another example, a single input/output module 15 may be used to connect to any of the memory controllers 20, through the PCIe switches 25, a single user device 10, such as a server or communications network interface, may use a large memory array as an attached storage device with both RAID and redundancy.

Figure 12A:
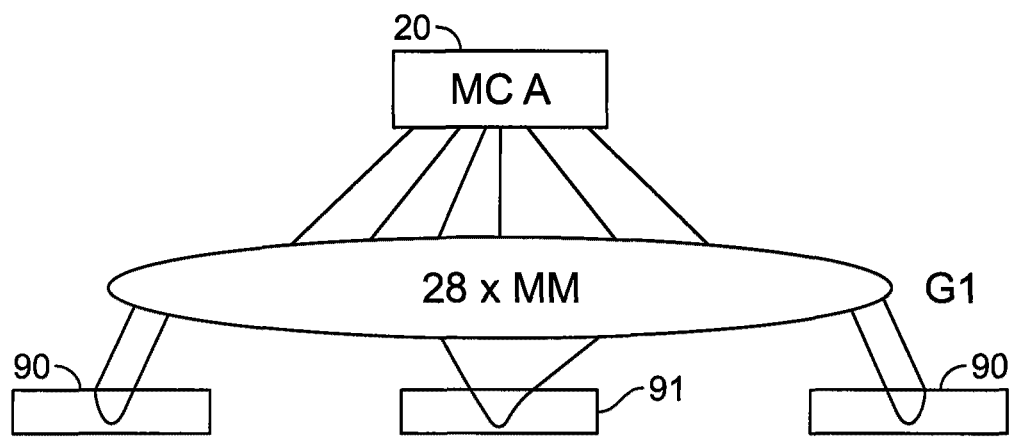
FIG. 12 a is a block diagram of a memory system comprising a single controller and a memory tree where the leafs of the tree are provided connectivity by a configuration module; and, FIG. 12b is a block diagram of the memory system of FIG. 12 a where one of the configuration modules is replaced by two interfaces to a memory controller.
Figure 12B:
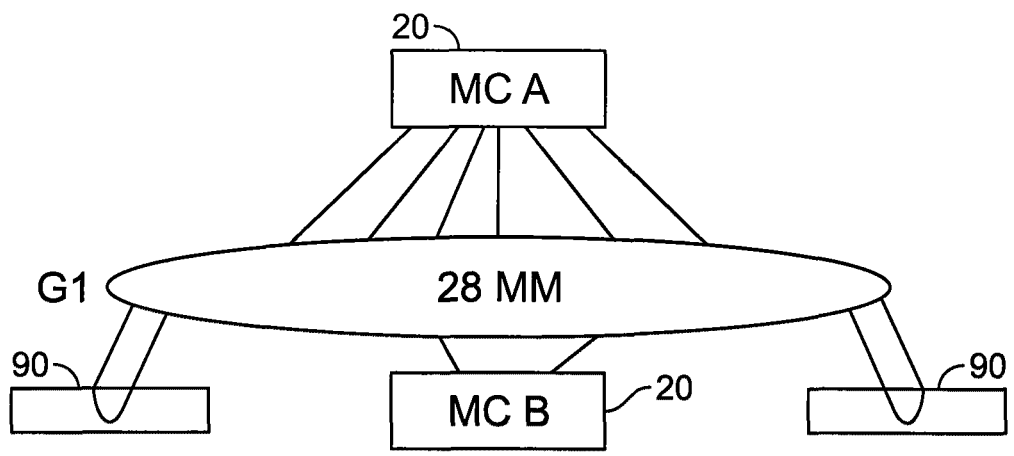

As previously described, the number of modules in a RAID group may be selected for specific performance attributes. The size of the motherboard, the number of connectors, and the like, may also be selected depending on the total amount of memory needed, and the current state-of-the-art in memory density. An example of a device having five 4+1 RAID groups and three spare modules is shown in FIG. 12*a*. The memory system has been configured by topology configuration modules 90 and 91 configured so that the leaf ends of modules within the memory group are connected through a topology configuration module. In alternative or expansion configurations, the topology configuration module may be replaced by a second controller as shown in FIG. 12*b*, or the bus segments 80 connected to corresponding bus segments 80 in another memory group that is, for example, a mirror image of the memory group shown, about a line along the topology configuration modules.

The physical location of the modules 30 may be determined by the electrical and mechanical aspects of design, such as providing for appropriate cooling, and control of bus segment length. Commonly, the connectors 110 for accommodating modules 30 may be disposed such that the long dimension of the connector 110 is orthogonal to a line of modules 30. This places the modules substantially parallel to each other in a row such that the separation of faces of the modules 30 is a distance having a value closer to a short dimension of the connector than to the length of the connector. The bus segments between the connectors 110 may be configured so that the pattern of connections of FIG. 6 may be achieved while ensuring that directly connected modules are not adjacent to each other. This may be of advantage, as mistakes in replacing modules commonly consist of pulling a module next to the actual failed module. Such errors may also be mitigated by configuring the RAID groups so that members of the same RAID group are not physically adjacent to each other.

The depths of the trees of memory modules and the number and location of interfaces between the memory modules and the memory controllers may depend on the specific design objectives of a product, and the examples herein are intended to be illustrative of the principles of design while being easily comprehended by a person of skill in the art, who would be able to apply the teachings to the design of more complex arrangements if needed.

Figure 13:
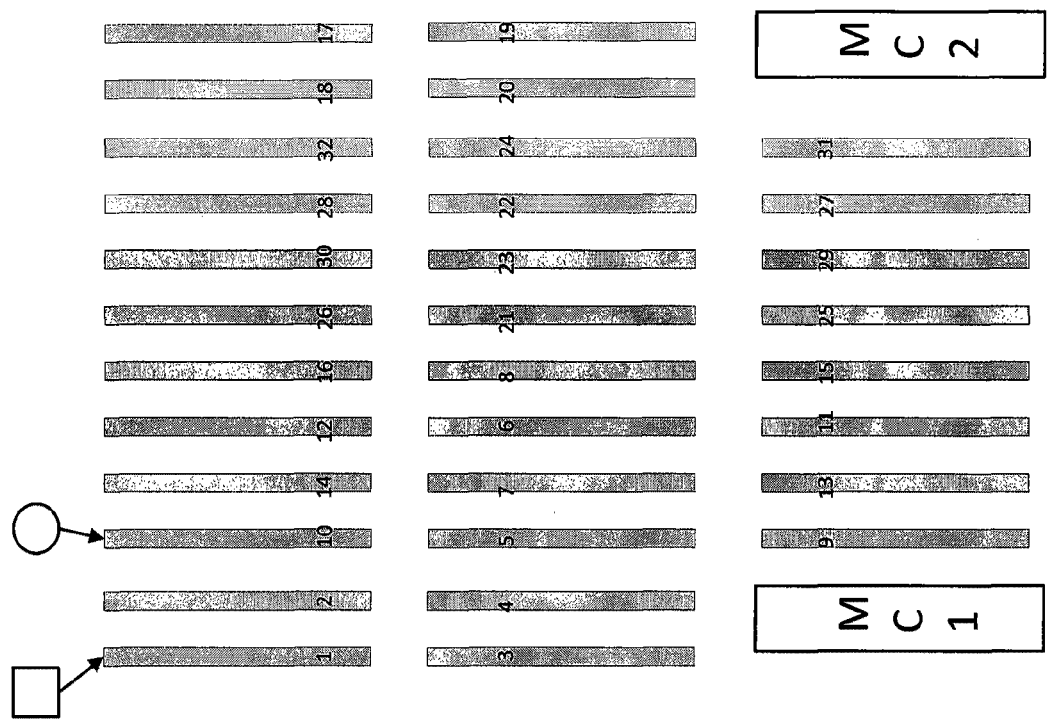
FIG. 13 is a logical connection diagram (left-hand-side) and a motherboard arrangement (right-hand-side) of a pair of memory trees interconnected through memory controllers (not shown)
Figure 13:
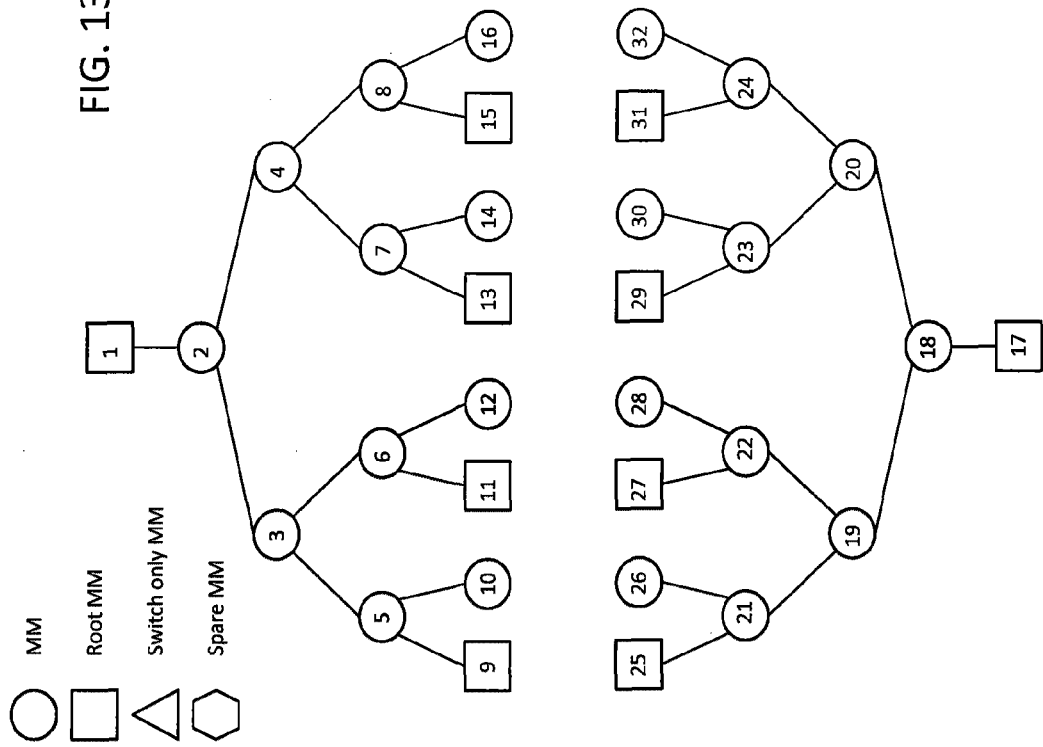

In another example, another modular approach to configuring the memory system is shown in FIG. 13. Here there are two trees having a capacity of 16 memory modules (MM) when fully populated. The left-hand-side of the figure is logical arrangement of the modules, showing each of the two trees as a separate structure. The functions of the modules, when the tree is fully populated are also shown. That is, a MM is a memory module having an associated memory circuit and a switch, such as a CSE, to route the signals to the associated memory or to one of a plurality of additional connection ports. When designated as a MM, the circuit receives information from another memory module and either uses the information data locally or passes the information to a selected memory module. A "root" memory module is a MM where one of the connection ports is connected via the bus to a memory controller (MC) (not shown). Where the tree is configured for RAID 4+1 storage, a total of 15 MM are needed for the data storage and redundancy. The 16$^{th}$ MM is used as a spare. Any of the 16 MM of the tree may be used as a spare MM. In some configurations, the position occupied by a MM may be filled by a module that does not have associated memory, and such a module may be termed a switch-only MM. Such a module may be used when the memory system is only partially populated, and provide for connectivity or the interface to other devices or systems.

In general, the module that is inserted into a connector as an MM may be a "system module", which may be one of a switch having at least three ports, each port adapted to communicate over a bus segment; or, a switch and a memory circuit communicating therewith; or, a passive connection between two bus segments.

The right-hand-side of FIG. 13 shows a physical layout of connectors on a motherboard that may correspond to the logical arrangement on the right-hand-side of the figure. The location of each memory module on a mother board is shown by associating the module number with the connector. In addition, the location of two multiport memory controllers MC1 and MC2 is shown. As will be described later, this physical arrangement is one where the layout of the traces on the motherboard is facilitated. Of course, other arrangements are possible.

Figure 14:
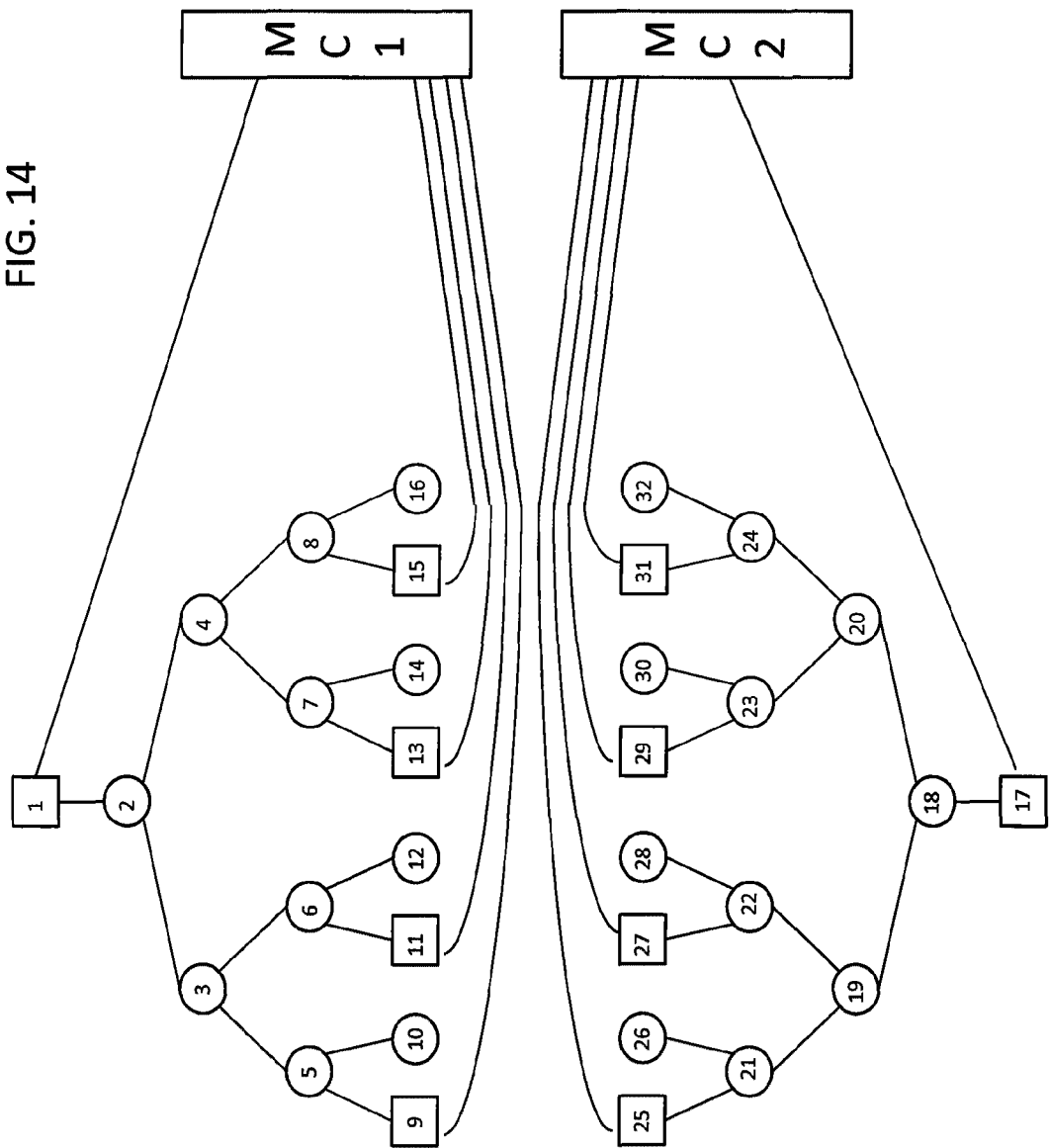
FIG. 14 is a logical connection diagram for the memory controllers providing the interconnection of the memory trees of FIG. 13.

Connectivity between the upper group of 16 modules (1-16) and the lower group of modules (25-320) may be achieved through the connections between the root MMs and the memory controllers MC1 and MC2, or by routing the data over other bus paths that will be shown in later figures. FIG. 14 shows an example of connectivity through the memory controllers. Each of the memory controllers may have a plurality of channels that may connect with a root MM over a bus, and an interface to a controller, computer, routing switch or the like. Providing that the memory controllers MC1 and MC2 communicate with each other, and are operable, all of the MMs of the 32 memory modules are capable of communicating with each other. The root memory modules of FIG. 13 are shown with only one connection, however they may have three ports. As described, one of the ports may be connected to a memory controller, and the other port connected to another device, which may be a root MM, a MM or a switch only MM. This is true as well of modules such as 10 and 32.

In a further aspect of the example, the motherboard may be less than fully populated. This may be desirable at some stage of the installed evolution of the memory system. The total installable capacity of the motherboard may not be needed at the time the device is installed. As is well known, storage requirements in an operating data base system or other computing applications tend to increase with time. The capacity of a modern memory system is such that the eventual capacity may be much greater than the initial capacity. Unused memory capacity is wasteful of capital costs, power and cooling. Moreover, the trend of the industry is that the cost of memory and other devices trends lower with time, and excess memory is thus seen as a economic waste.

Yet, in operating a memory system with less than a full population, consideration needs to be given to maintaining the data integrity at the level that is intended. So, when less than all of the memory is installed, the configuration needs to maintain sufficient connectivity and spare capacity even when there are one or more hardware failures.

Figure 15:
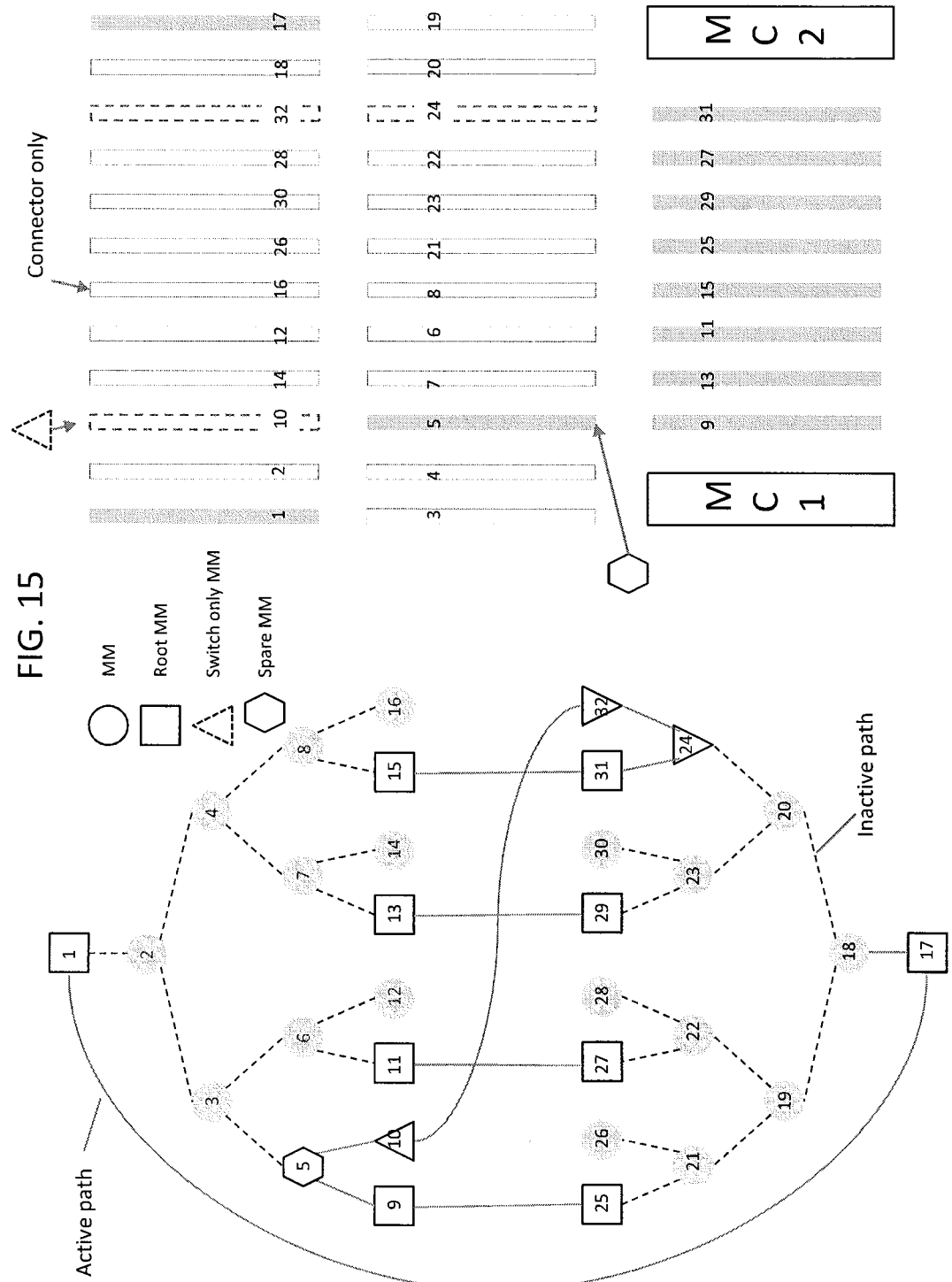
FIG. 15 is a logical connection diagram of the pair of memory trees of FIG. 13, where additional bus interconnection paths are provided, and (right-hand-side) the motherboard arrangement where two RAID 4+1 groups and a spare module are populated.

FIG. 15 shows the motherboard of FIG. 13 where only two 4+1 RAID groups are populated. Also shown are bus connections between root MMs and between two switch only MMs so as to maintain connectivity. In this example, MMs 10, 24 and 32 are shown as switch only MMs and MM 5 is shown as a spare MM. This is only one of a myriad of arrangements which would achieve the same objective. Also, in this example, switch MMs 10 and 32 could have been replaced with passive jumpers, as no switching function is performed. The active bus paths are shown as heavier lines. The other lines and connector positions are unpopulated. The right-hand-side of FIG. 15 shows the motherboard layout with the populated connectors designated.

The configuration of the installed modules may be explored by the system and memory controllers at initialization, and periodically so as to determine the connectivity that may be possible, and to report, or consider the effect of a failure on the data integrity.

The motherboard of FIG. 13 may be fully populated with a total of 32 MMs (MMs and root MMs). For such a configuration, jumpers or switch only MMs are not needed, and any two MMs (which could include root MMs) are available as spares, while providing six 4+1 RAID groups. This configuration can, for example, tolerate the failure of memory controller and any two module failures, providing that two module failures do not occur in the same RAID group before the data has been recovered.

Figure 16:
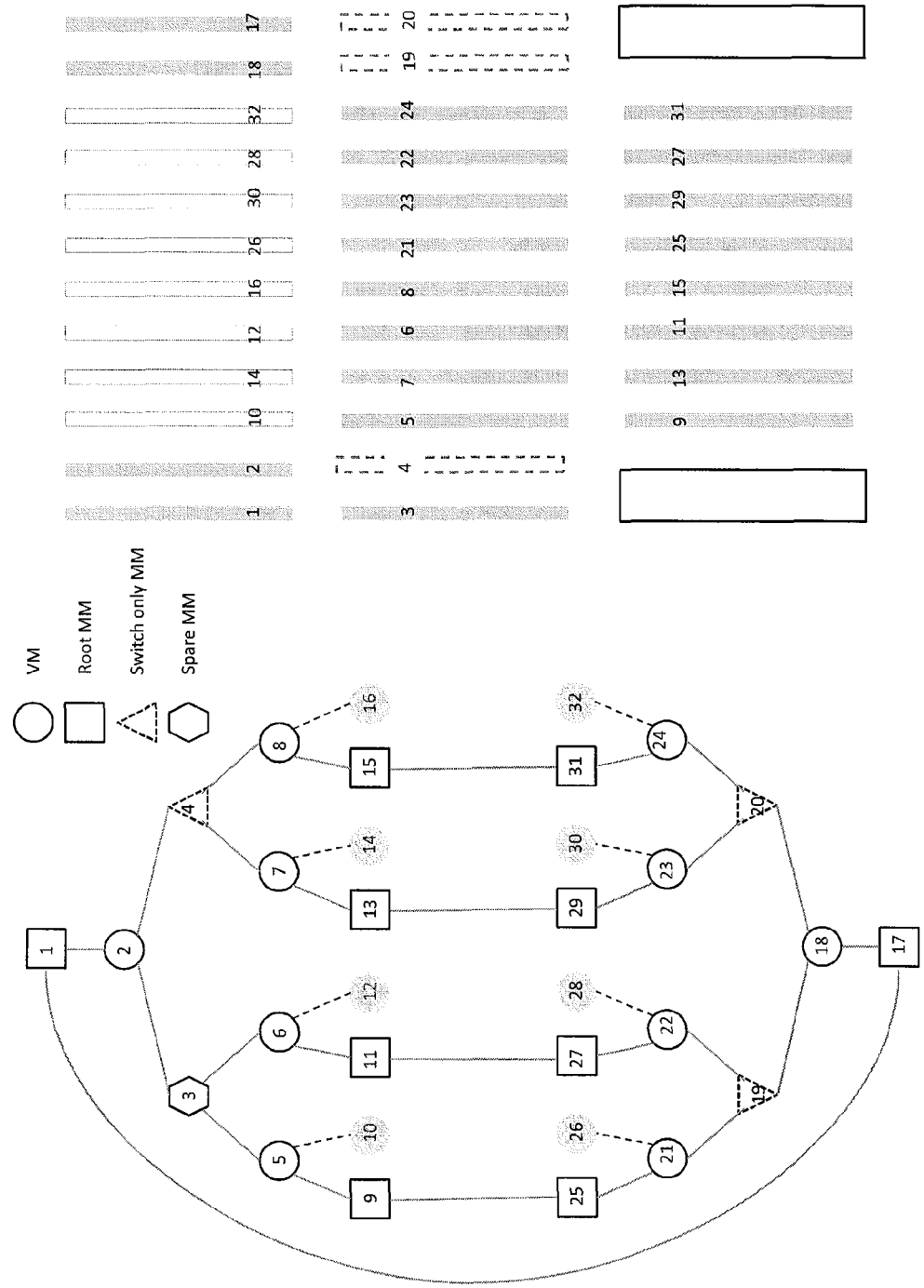
FIG. 16 is a logical connection diagram of the pair of memory trees of FIG. 13, where additional bus interconnection paths are provided, and (right-hand-side) the motherboard arrangement where four RAID 4+1 groups and a spare module are populated.
Figure 17:
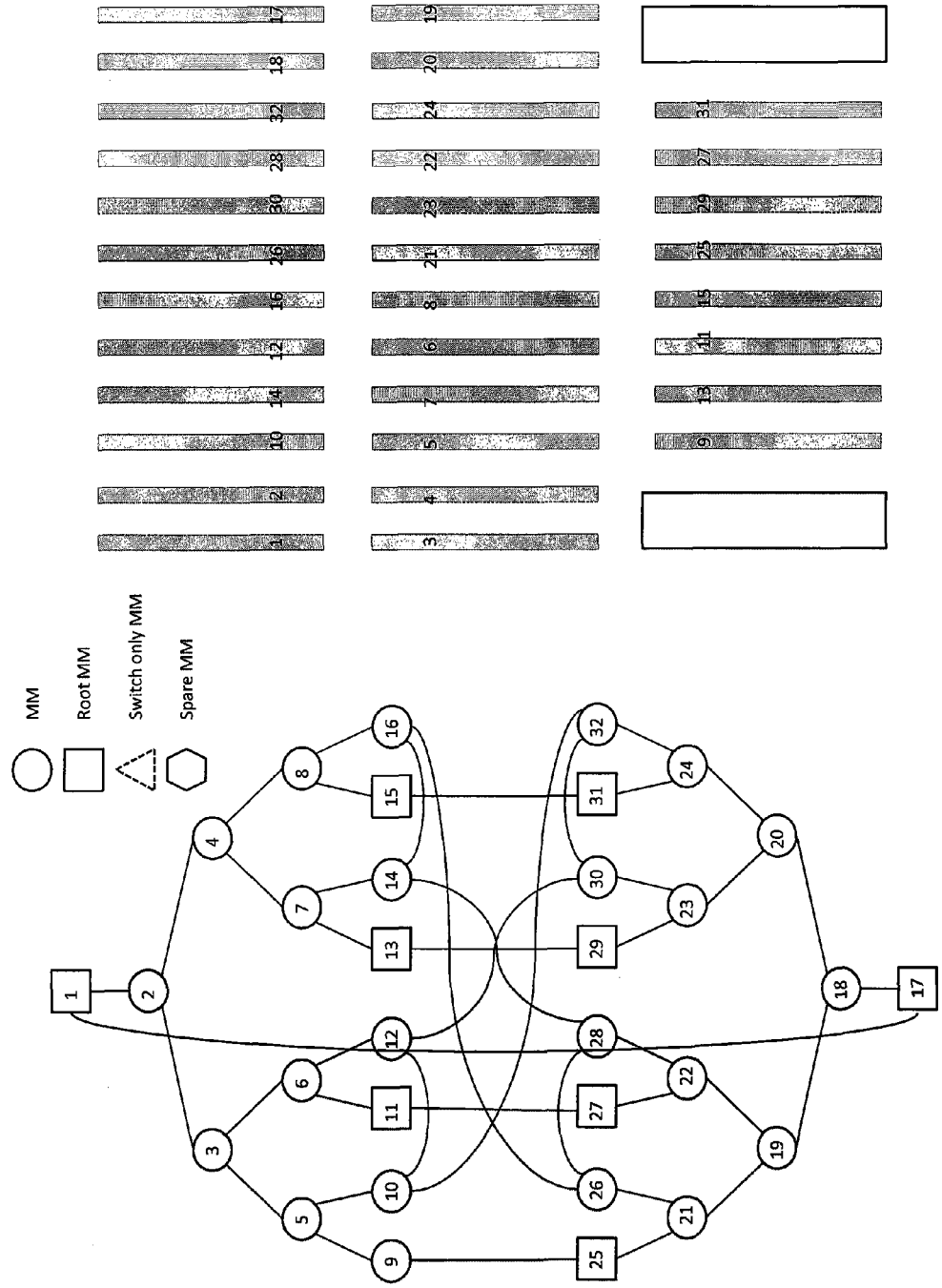
FIG. 17 is a logical connection diagram of the pair of memory trees of FIG. 13, where additional bus interconnection paths are provided, and (right-hand-side) the motherboard arrangement where six RAID 4+1 groups and two spare modules are populated (full population)
Figure 18:
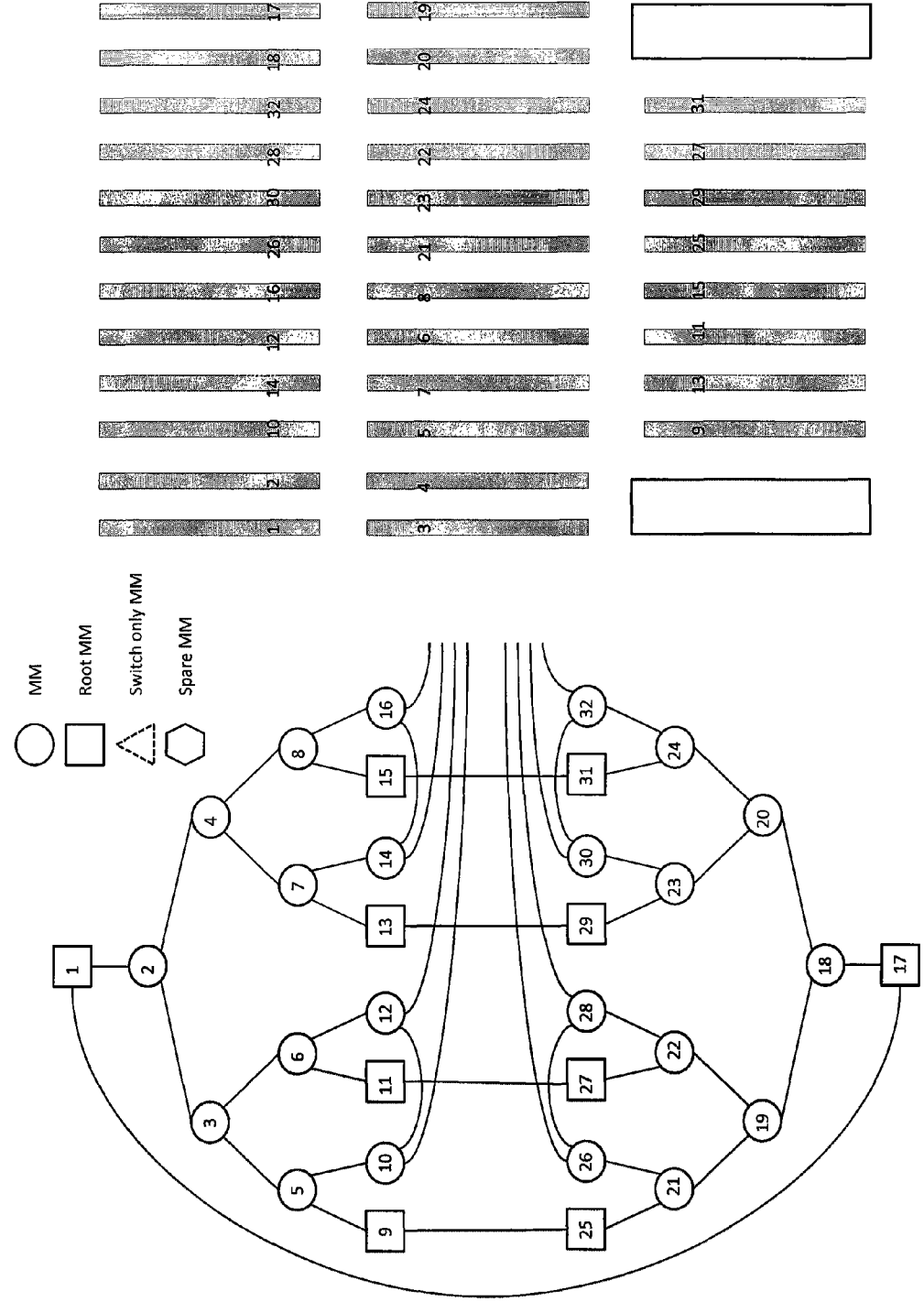
FIG. 18 is a logical connection diagram (left-hand-side) and a motherboard arrangement (right-hand-side) of a pair of memory trees, where the pair of memory trees is intended to be connected to a similar pair of memory trees.

Larger scale memory motherboards are possible. FIG. 17 illustrates the left-hand-side of a logical arrangement that is intended to be part of a 64 MM device. The general connectivity is similar to that of FIG. 16, but most of the leaf connectivity is routed to another portion of the memory (not shown). A completely populated 64 MM device is shown in FIG. 18. Here, there can be at least four 5-channel memory controllers (not shown), and one may imagine that failure of three of the four memory controllers could be tolerated, although the throughput may be reduced. Since such a constellation of failures is not expected except in a disaster situation, for which other data recovery means would need to be provided, the memory system will have a high availability and data reliability consistent with modern data center requirements. As the MCs and the MMs may be hot-swapped, the number of modules out of service at any time would be within the adaptation capabilities such a system.

Figure 19:
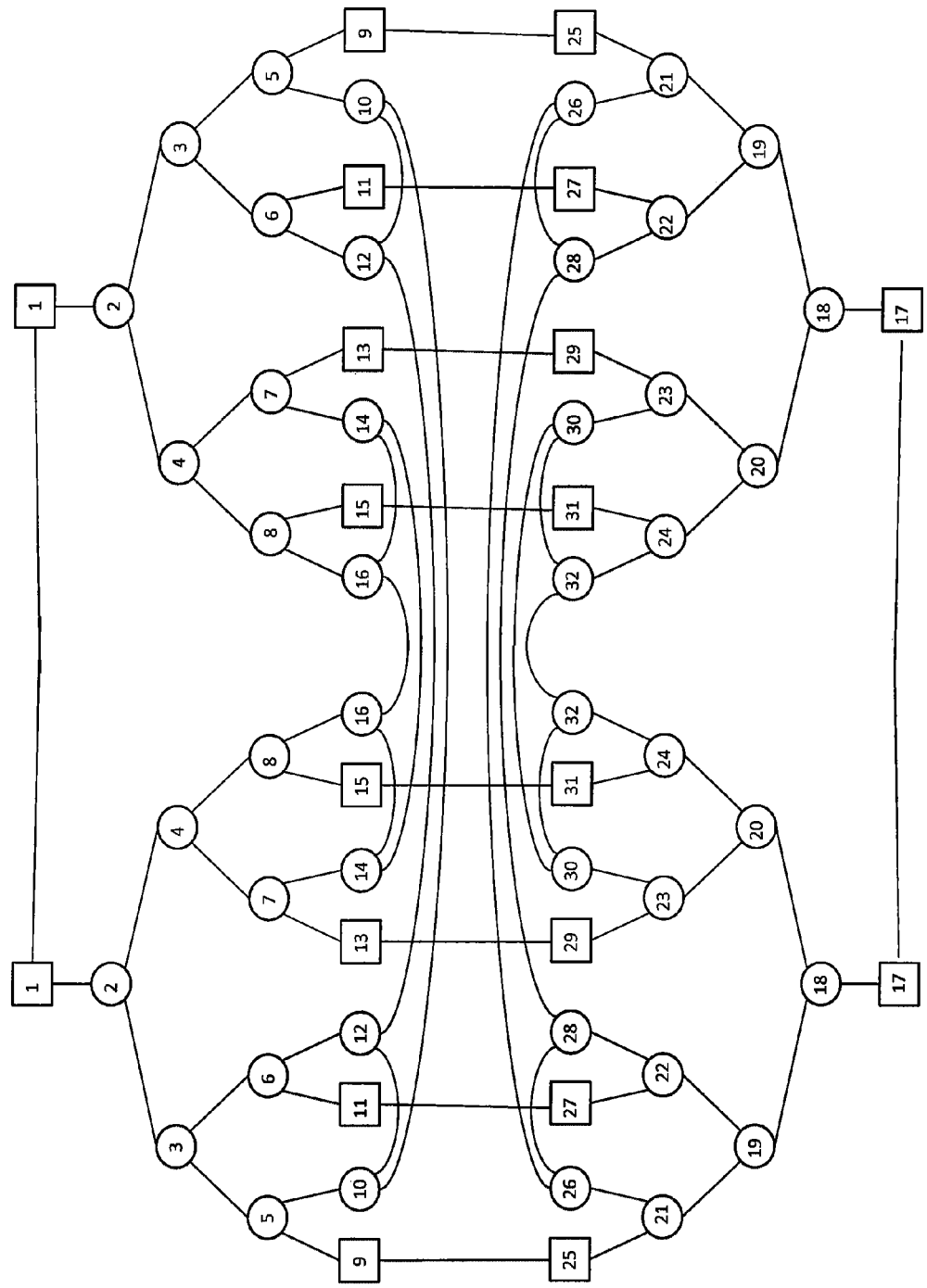
FIG. 19 is an example of two of the memory arrangements of FIG. 19 are connected to form a 64 module memory system.
Figure 20:
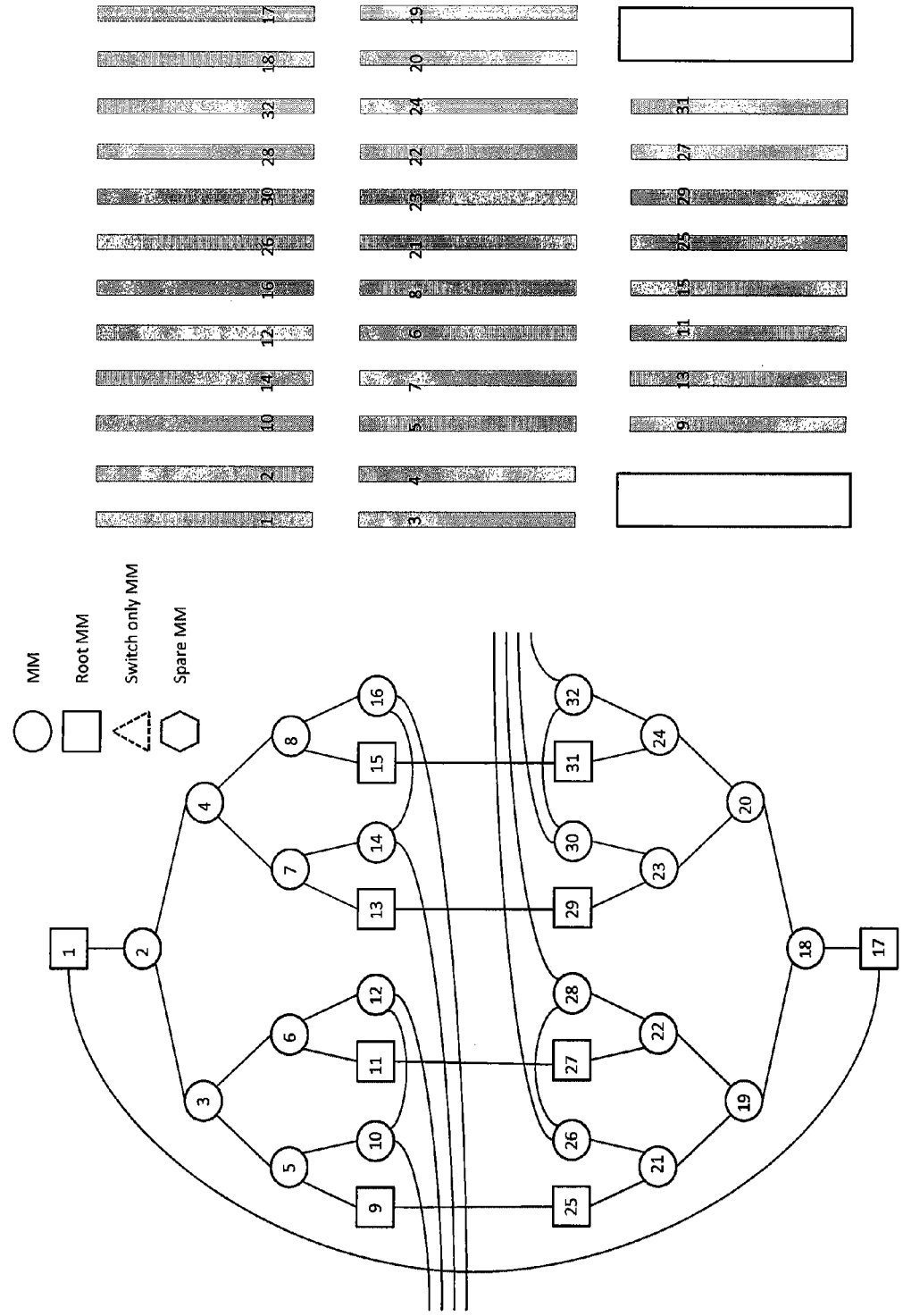
FIG. 20 is an example of a logical connection diagram (left-hand-side) and a motherboard arrangement (right-hand-side) of a pair of memory trees, where the pair of memory trees is intended to be connected to a similar pairs of memory trees similar to that shown in FIG. 18 at the right and left hand interfaces.

In an existing design, the spacing of connectors may be about 12.5 mm, and a total of at least 96 memory modules and 4 controllers may be installed in a rack mounted format on one motherboard. This density of packaging makes large-scale memories quite compact using existing FLASH memory circuits, and will become more compact as the trend continues towards higher capacity circuits in the same or similar form factor. While one may consider that the memory modules MM are comprised primarily a single memory type, such as FLASH, the capacity of the FLASH circuits on individual memory modules MM may differ as they may have been installed at differing times. Moreover, other memory circuit types including DRAM, SRAM and others being developed may be deployed on memory modules MM, providing that the MM interface to the bus is compatible. Such a memory card system was described in U.S. Ser. No. 12/079,364, entitled "Universal Memory Socket and Card and System for Using the Same," which is commonly assigned, and which is incorporated herein by reference.

Where a motherboard capable of accepting 96 MMs is desired, the arrangement of a central group of 32 modules is shown in FIG. 19, and a complete 96 MM memory system is shown in FIG. 20.

Routing of traces on the motherboard so as to provide connectivity is facilitated where the MMs are configured with a configurable switching element (CSE) such as shown in FIG. 2, and further described in U.S. Ser. No. 11/405,083, entitled "Interconnection System," which is commonly assigned and which is incorporated herein by reference. In a design example, the connectors are spaced by about 12.5 mm in a direction transverse to the long dimension thereof, and four connectors spaced such that the 4 connectors fills the width of a motherboard compatible with mounting in an enclosure suitable for installation.

Figure 21:
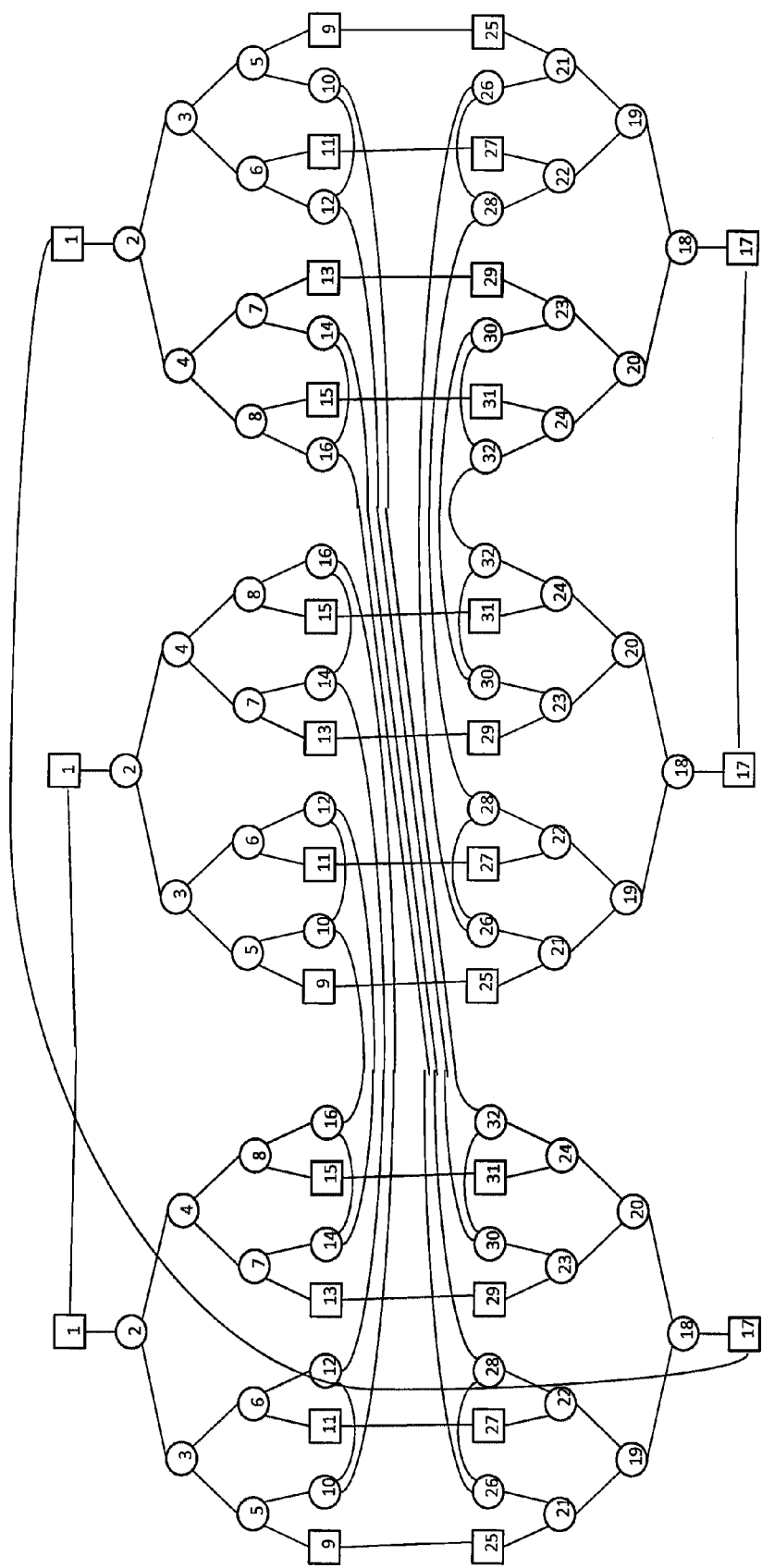
FIG. 21 is an example of two of the memory arrangements of FIG. 19 and the memory arrangement of FIG. 20 interconnected to form a 96 module memory system.

In this design, the total width which would be needed to accommodate the traces for all aspects of a connection bus between modules is about 38 mm. FIG. 21, corresponding to a motherboard for a 32 MM capacity system, shows the routing of the bus connections in a representative way. In this figure, the orientation of the connector layout of FIG. 16 has been rotated by 90°, and may be visualized as a top X-ray view of the motherboard, where the bottom of the figure corresponds to the front of the motherboard, and the top of the figure corresponds to the back of the motherboard, where the motherboard is mounted horizontally.

Figure 22:
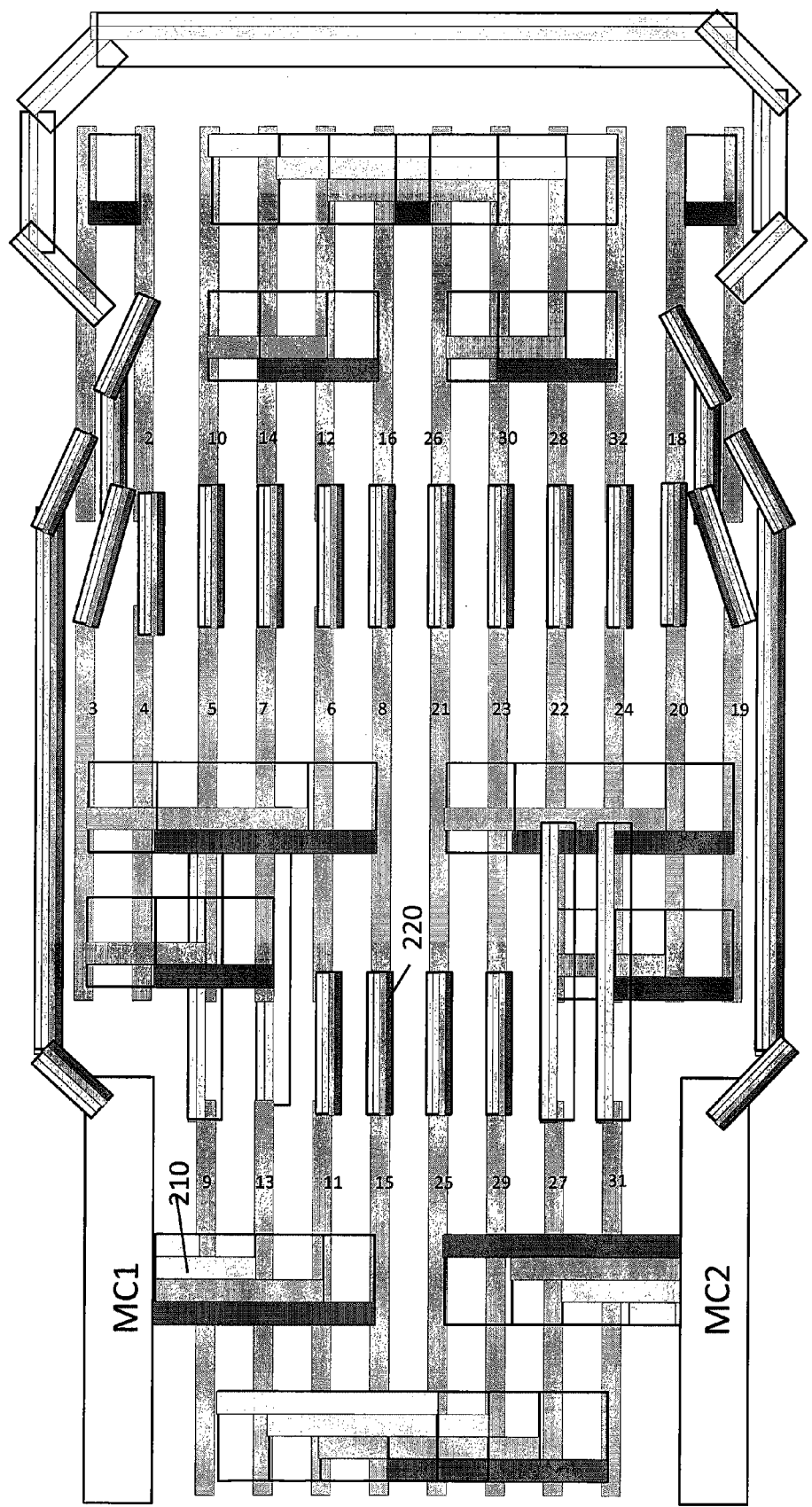
FIG. 22 shows a schematic representation of the bus arrangements of a printed circuit motherboard where the bus layout is suitable for the arrangement of FIG. 16.
Figure 23:
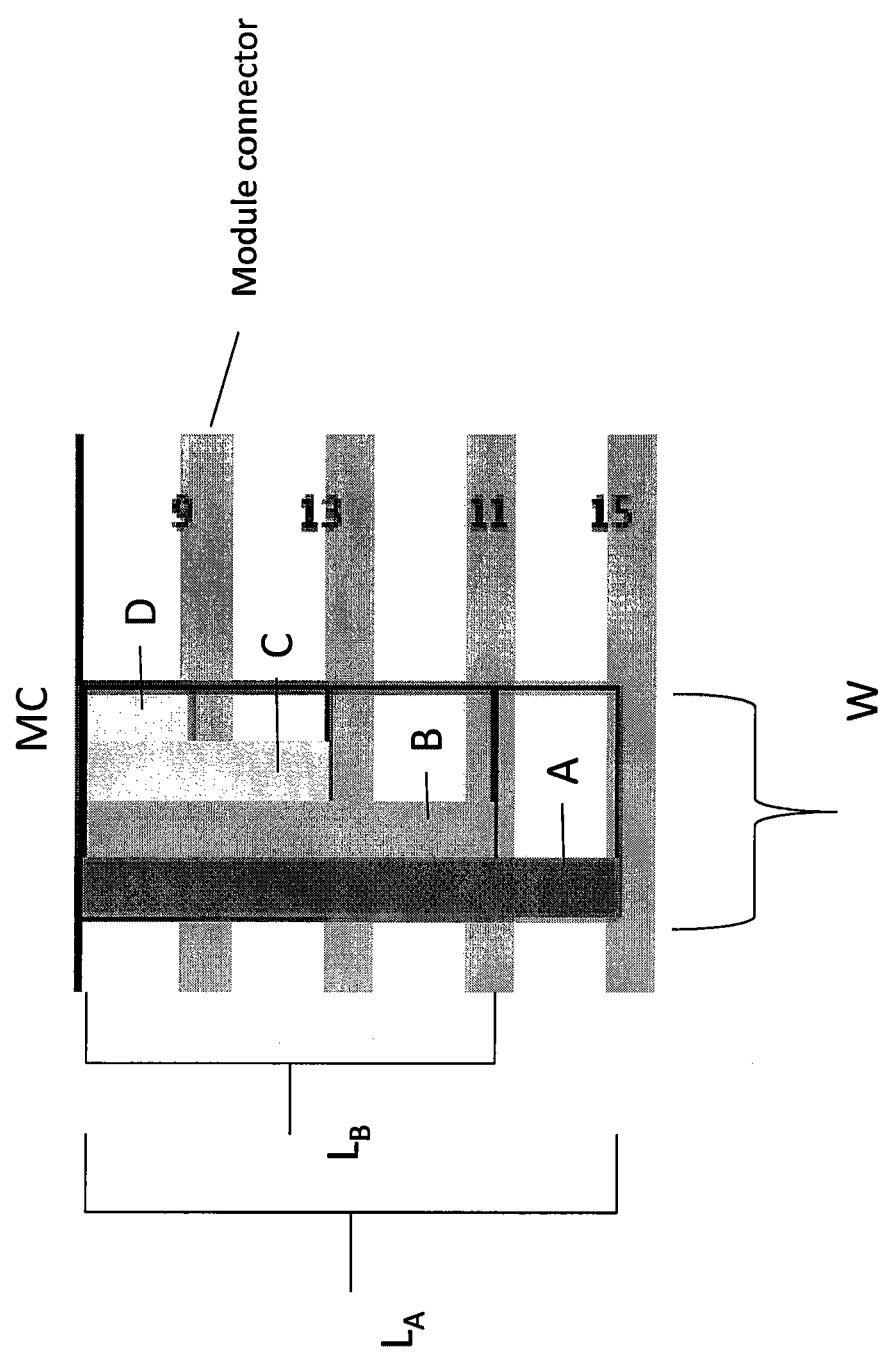
FIG. 23 is a detail of a portion of a bus arrangement of FIG. 22 where four different busses are positioned one above another on individual printed circuit board layers.
Figure 24:
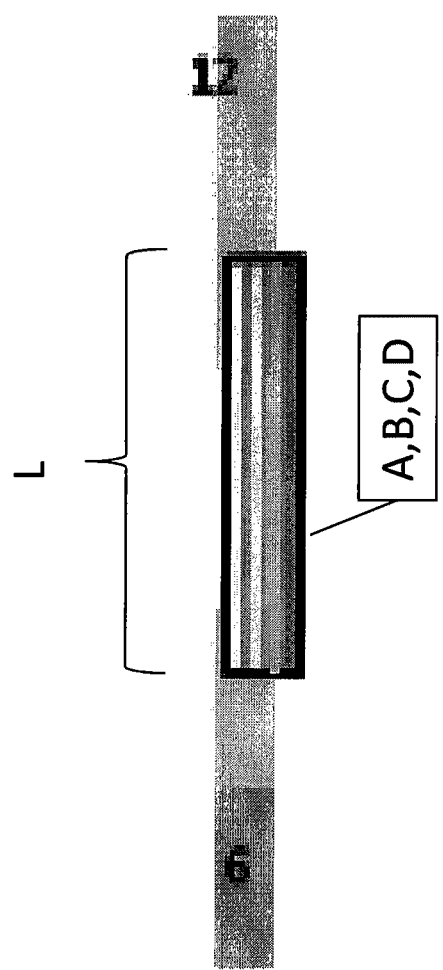
FIG. 24 is another detail of a bus arrangement of FIG. 22 where a bus is routed on four different layers of the printed circuit board.

The representation of the bus routing may be understood with reference to FIG. 22, representing the group of 4 bus segments 210 of FIG. 21. The bus segments have a width W, which may be about 38 mm. The length of each bus segment depends on the connectors which the bus segment connects. For example, the bus segment connecting MM15 and the MC has a length $L_A$ and the bus segment connecting MM11 and the MC has a length $L_B$. The bus segment with length $L_A$ is routed on a layer A of the motherboard and the bus segment $L_B$ is routed on a layer B of the motherboard. Similarly, the bus segment from MM13 to the MC and the bus segment from MM9 to the MC are routed on layers C and D respectively. Referring to FIG. 21, one may observe that only PC board layers are used to route all of the bus segments between connectors. So, as shown in FIG. 21, the different densities of shading are keys that indicate which layer of the layers A, B, C, D is allocated to a bus of width W. Other layers of a PC board may be used for ground, power and the like. A bus between connectors in line with each other is routed somewhat differently. Since the width of a single-layer bus, being 38 mm is greater than the spacing in the transverse direction between adjacent connectors (e.g., MM25 to MM15) multiple adjacent rows of connectors would result in interference between the traces. However, only one bus segment is needed between, for example MM15 and MM8. In this instance, as shown in FIG. 23, about one-fourth of the width of the bus 220 is accommodated in each of the four PC board layers. Various combinations of the routing arrangements are used to connect the connectors of the motherboard, as shown in FIG. 21.

Although the present invention has been explained by way of the examples described above, it should be understood to the ordinary skilled person in the art that the invention is not limited to the examples, but rather that various changes or modifications thereof are possible without departing from the spirit of the invention.

What is claimed is:

1. An interconnect system, comprising:
a plurality of connectors having a first configuration;
a plurality of point-to-point bus segments on a motherboard, the bus segments disposed such that each connector of the plurality of connectors is connected to an end of two or more bus segments; and
a memory controller communicating with at least one bus segment;
the interconnect system further comprising:
a plurality of memory modules inserted in the connectors, wherein a number M of plurality of memory modules is less than or equal to the a number N of the connectors; at least some of the plurality of memory modules having a configurable switch for routing signals received on a first bus segment to one of a second bus segment, a third bus segment, or a memory circuit associated with the memory module,
wherein the interconnect system is configured to provide connectivity between the memory controller and the plurality of memory modules in a first state where a memory module of the plurality of memory modules is either inoperative, or is removed from a respective connector.

2. The system of claim 1, where in the memory controller is configurable to provide connectivity in the first state.

3. The system of claim 1, wherein a configuration module inserted in a connector is configurable to provide connectivity in the first state.

4. The system of claim 3, wherein the configuration module is a configurable switch.

5. The system of claim 1, wherein when M is equal to N, connectivity is maintained in a second state where two non-adjacent memory modules of the plurality of memory modules are either inoperative or are removed from their respective connectors.

6. The system of claim 1, wherein, when M is less than N, a memory module is insertable into any one of the M-N connectors that do not have a memory module inserted, without interrupting the connectivity between already inserted memory modules.

7. An interconnect system, comprising:
a plurality of first connectors having a same configuration and mounted on the mother board;
a plurality of point-to-point bus segments disposed on a mother board, the connectors disposed such that each connector of a first group of first connectors of the plurality of first connectors is connected to two or more first bus segments;

a first interface connected to an end of each of two first bus segments of the plurality of first bus segments, the first bus segments having another end connected to connectors of the plurality of first connectors; and a second interface connected to an end of at least one bus segment of the plurality of first bus segments having another end connected a connector of the plurality of first connectors;

wherein the first interface is adapted to receive a topology configuration module and the second interface is adapted to connect to a module controller.

8. The system of claim 7, wherein the topology configuration module is adapted to one of: connect the ends of the two first bus segments connecting to the first interface to each other; or, to connect the ends of the two first bus segments connecting to the first interface to ends of two first bus segments connecting to a second first interface.

9. The system of claim 7, wherein the first interface is a second connector having a different configuration than the first connector.

10. The system of claim 9, wherein the second interface is a portion of the second connector.

11. The system of claim 7, wherein another end of the bus segment of the plurality of first bus segments connected to a first first connector is connected to either a second first connector, the first interface, or the second interface.

12. The system of claim 7, further comprising:
a second group of first connectors; disposed such that each connector of the second group of first connectors is connected to three bus segments;
a second first interface connected to an end of each of two bus segments of the plurality of second bus segments, the bus segments having another end connected connectors of the second first connectors; and,
a second second interface connected to an end of at least one bus segment of the plurality of second bus segments.

13. The system of claim 12, wherein the second first interface is adapted to receive the topology configuration module, and the second second interface is adapted to receive at least one of a second topology configuration module or a second module controller.

14. The system of claim 13, wherein the topology configuration module is adapted to one of: connect the ends of two first bus segments connecting to a first first interface to ends of two second bus segments connected to a second first interface; or, to connect the ends of the two second bus segments connecting to the second first interface to each other.

15. The system of claim 13, wherein a second topology connection module is adapted to at least one of: connect the ends of pairs of second bus segments connecting to the second first interface to each other; or, to connect an end of at least one second bus segment connected to the second second interface to a memory controller.

16. An interconnect system, comprising:
a motherboard;
a plurality of same connectors;
a plurality of point-to-point bus segments, disposed such that each connector of a first group of first connectors of the plurality of first connectors are connected to three or more first bus segments;
an interface connected to an end of at least one bus segment of the plurality of first bus segments having another end connected a connector of the plurality of first connectors; and
wherein first interface is adapted to connect to a module controller, and a connector of a plurality of connectors is adapted to connect to a system module; and, the connectors, the interface and the bus segments are arranged such that connectivity between any two connectors is maintained when at least two non-adjacent connectors do not have system modules installed.

17. The interconnect system of claim 16, further comprising a system module adapted to mate with the connector of the plurality of connectors, the system module comprising one of:
a configurable switch having at least three ports, each port adapted to communicate over a bus segment; or, a configurable switch and a memory circuit communicating therewith; or, a passive connection between two bus segments.

18. The interconnect system of claim 17, further comprising a memory controller having a port adapted to communicate with a system module.

19. The system of claim 1, wherein when M is equal to N, connectivity is maintained in a third state where three non-adjacent memory modules of the plurality of memory modules are either inoperative or are removed from their respective connectors.

20. The system of claim 1, wherein each connector of the plurality of connectors is mounted to the motherboard and is adapted to receive a pluggable memory module.

21. The system of claim 1, wherein at least some of the plurality of memory modules have a switch configured to selectably route signals received on a first bus segment to a second bus segment, a third bus segment, or to a memory circuit associated with the memory module.

* * * * *